(12) United States Patent
Yu

(10) Patent No.: US 11,676,890 B2
(45) Date of Patent: Jun. 13, 2023

(54) SEMICONDUCTOR PACKAGE AND PACKAGE-ON-PACKAGE INCLUDING THE SAME

(71) Applicant: SAMSUNG ELECTRONICS CO., LTD., Suwon-si (KR)

(72) Inventor: Bongken Yu, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 163 days.

(21) Appl. No.: 17/198,332

(22) Filed: Mar. 11, 2021

(65) Prior Publication Data
US 2022/0020676 A1 Jan. 20, 2022

(30) Foreign Application Priority Data
Jul. 15, 2020 (KR) .................. 10-2020-0087652

(51) Int. Cl.
| | |
|---|---|
| H01L 23/48 | (2006.01) |
| H01L 23/498 | (2006.01) |
| H01L 25/18 | (2023.01) |
| H01L 23/31 | (2006.01) |
| H01L 21/56 | (2006.01) |
| H01L 25/10 | (2006.01) |

(Continued)

(52) U.S. Cl.
CPC ...... *H01L 23/49833* (2013.01); *H01L 21/561* (2013.01); *H01L 23/3128* (2013.01); *H01L 23/3135* (2013.01); *H01L 23/49811* (2013.01); *H01L 23/49816* (2013.01); *H01L 23/49822* (2013.01); *H01L 23/49838* (2013.01); *H01L 25/105* (2013.01); *H01L 25/18* (2013.01); *H01L 21/304* (2013.01); *H01L 23/295* (2013.01); *H01L 2225/1023* (2013.01); *H01L 2225/1035* (2013.01); *H01L 2225/1041* (2013.01); *H01L 2225/1058* (2013.01)

(58) Field of Classification Search
CPC ....... H01L 23/28; H01L 23/295; H01L 23/31; H01L 23/3135; H01L 2924/181
USPC .......................................................... 257/787
See application file for complete search history.

(56) References Cited

U.S. PATENT DOCUMENTS

| | | | |
|---|---|---|---|
| 5,600,180 A * | 2/1997 | Kusaka ................... | H01L 24/11 257/737 |
| 7,029,949 B2 | 4/2006 | Farnworth et al. | |
| 7,993,983 B1 | 8/2011 | Lin | |

(Continued)

FOREIGN PATENT DOCUMENTS

KR  10-2007-0051165  5/2007

*Primary Examiner* — Nitin Parekh
(74) *Attorney, Agent, or Firm* — F. Chau & Associates, LLC

(57) ABSTRACT

A semiconductor package that includes a support wiring structure. A semiconductor chip is on the support wiring structure. A cover wiring structure is on the semiconductor chip. A plurality of connection structures penetrates a filling member and electrically connects the support wiring structure to the cover wiring structure. The filling member fills a space between the support wiring structure and the cover wiring structure. The filling member surrounds the plurality of connection structures and the semiconductor chip and includes a plurality of fillers. A partial portion of the plurality of fillers includes cutting fillers having a flat surface that extends along a vertical level that is a reference level.

19 Claims, 22 Drawing Sheets

(51) Int. Cl.
  *H01L 23/29* (2006.01)
  *H01L 21/304* (2006.01)

(56) References Cited

U.S. PATENT DOCUMENTS

| | | |
|---|---|---|
| 9,099,444 B2 | 8/2015 | Mallik et al. |
| 9,245,771 B2 | 1/2016 | Chung et al. |
| 9,287,203 B2 | 3/2016 | Lin et al. |
| 9,941,207 B2 | 4/2018 | Lin |
| 10,297,552 B2 | 5/2019 | Kim et al. |
| 10,361,122 B1* | 7/2019 | Hsieh .................... H01L 21/565 |
| 10,510,644 B2 | 12/2019 | Hsiao et al. |
| 10,777,518 B1* | 9/2020 | Wang .................. H01L 21/4857 |
| 2004/0262774 A1* | 12/2004 | Kang ...................... H01L 24/11 |
| | | 257/E23.021 |
| 2017/0033063 A1* | 2/2017 | Lin ...................... H01L 21/6835 |
| 2018/0061813 A1* | 3/2018 | Hsieh .................. H01L 23/3114 |
| 2018/0108638 A1* | 4/2018 | Lin .......................... H01L 24/97 |
| 2019/0131196 A1* | 5/2019 | Cook ...................... H01L 23/28 |
| 2020/0020634 A1* | 1/2020 | Tsai ........................ H01L 24/73 |
| 2020/0294964 A1* | 9/2020 | Min ...................... H01L 23/295 |
| 2021/0057298 A1* | 2/2021 | Tsai .................... H01L 21/6835 |
| 2021/0134711 A1* | 5/2021 | Fang ...................... H01L 24/73 |

* cited by examiner

SEMICONDUCTOR PACKAGE AND PACKAGE-ON-PACKAGE INCLUDING THE SAME

CROSS-REFERENCE TO RELATED APPLICATION

This application claims priority under 35 U.S.C. § 119 to Korean Patent Application No. 10-2020-0087652, filed on Jul. 15, 2020 in the Korean Intellectual Property Office, the disclosure of which is incorporated by reference in its entirety herein.

TECHNICAL FIELD

The present inventive concepts relate to a semiconductor package and a package-on-package including the same, and more particularly, to a fan-out semiconductor package and a package-on-package including the same.

DISCUSSION OF RELATED ART

As the electronics industry and the demands of users have developed rapidly, electronic devices have become increasingly compact and lightweight. Accordingly, semiconductor devices, which are main components of electronic devices, have required a high level of integration. In addition, in view of the development of mobile electronic devices, the semiconductor devices applied thereto are required to be both miniaturized and multifunctional.

Accordingly, to provide a multi-functional semiconductor package, a package-on-package (PoP)-type semiconductor package has been developed in which semiconductor packages having different functions are stacked on one semiconductor package.

SUMMARY

The present inventive concepts provide a semiconductor package providing reliability of electrical connection to another semiconductor package to be stacked thereon, and a semiconductor package of package-on-package (PoP)-type including the same.

The present inventive concepts provides a semiconductor package and a PoP including the same as follows.

A semiconductor package according to the present inventive concepts includes a support wiring structure. A semiconductor chip is on the support wiring structure. A cover wiring structure is on the semiconductor chip. A plurality of connection structures penetrates a filling member and electrically connects the support wiring structure to the cover wiring structure. The filling member fills a space between the support wiring structure and the cover wiring structure. The filling member surrounds the plurality of connection structures and the semiconductor chip and includes a plurality of fillers. A partial portion of the plurality of fillers includes cutting fillers having a flat surface that extends along a vertical level that is a reference level.

A semiconductor package according to the present inventive concepts includes a support wiring structure. A semiconductor chip is on the support wiring structure. The semiconductor chip has an upper surface positioned at a vertical level that is a reference level. A cover wiring structure is on the semiconductor chip. A plurality of connection structures penetrates a filling member and is configured to electrically connect the support wiring structure to the cover wiring structure. The plurality of connection structures are spaced apart from the semiconductor chip, and are arranged around the semiconductor chip. Each of the plurality of connection structures includes a lower connection unit having an upper surface positioned at the reference level and extending below the reference level and an upper connection unit having a lower surface positioned at the reference level and extending above the reference level. The filling member fills a space between the support wiring structure and the cover wiring structure. The filling member surrounds the plurality of connection structures and comprises a plurality of fillers. A partial portion of the plurality of fillers comprises cutting fillers having an upper surface that is a flat surface that extends along the reference level.

A package-on-package according to the present inventive concepts includes a first semiconductor package comprising a first printed circuit board (PCB), a first semiconductor chip on the first PCB and having an upper surface positioned at a vertical level that is a reference level, a second PCB on the first semiconductor chip and a filling member filling a space between the first PCB and the second PCB. The filling member surrounds the first semiconductor chip and contains a plurality of fillers. A plurality of connection structures penetrates the filling member. The plurality of connection structures is configured to electrically connect the first PCB to the second PCB. A second semiconductor package comprises a second semiconductor chip and a package connection terminal attached to a portion of a plurality of second wiring patterns and configured to electrically connect the second semiconductor chip to the first semiconductor package. The second semiconductor package is stacked on the first semiconductor package. A partial portion of the plurality of fillers are cutting fillers having an upper surface that is a flat surface that extends along the reference level and a side surface that is a curved surface and is positioned at a vertical level that is lower than the reference level.

BRIEF DESCRIPTION OF THE DRAWINGS

Embodiments of the present inventive concepts will be more clearly understood from the following detailed description taken in conjunction with the accompanying drawings in which.

DETAILED DESCRIPTION OF EMBODIMENTS

Figure 1A:
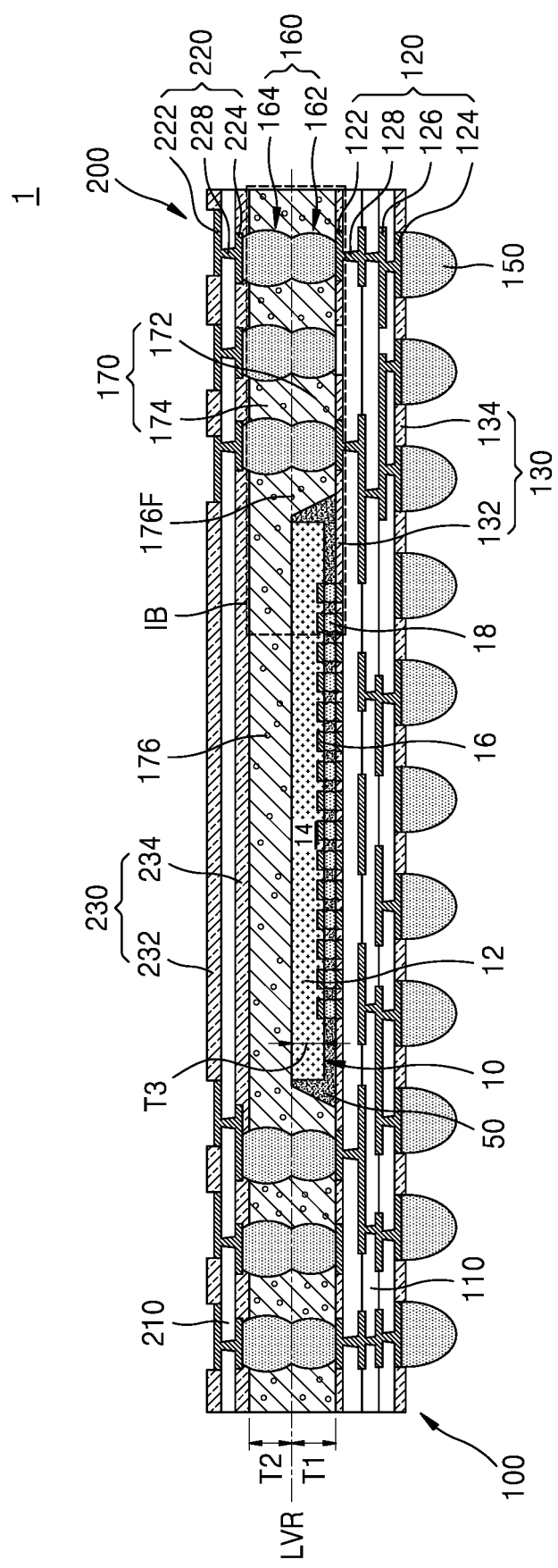
FIG. 1A is a cross-sectional view of a semiconductor package according to an embodiment of the present inventive concepts.
Figure 1B:
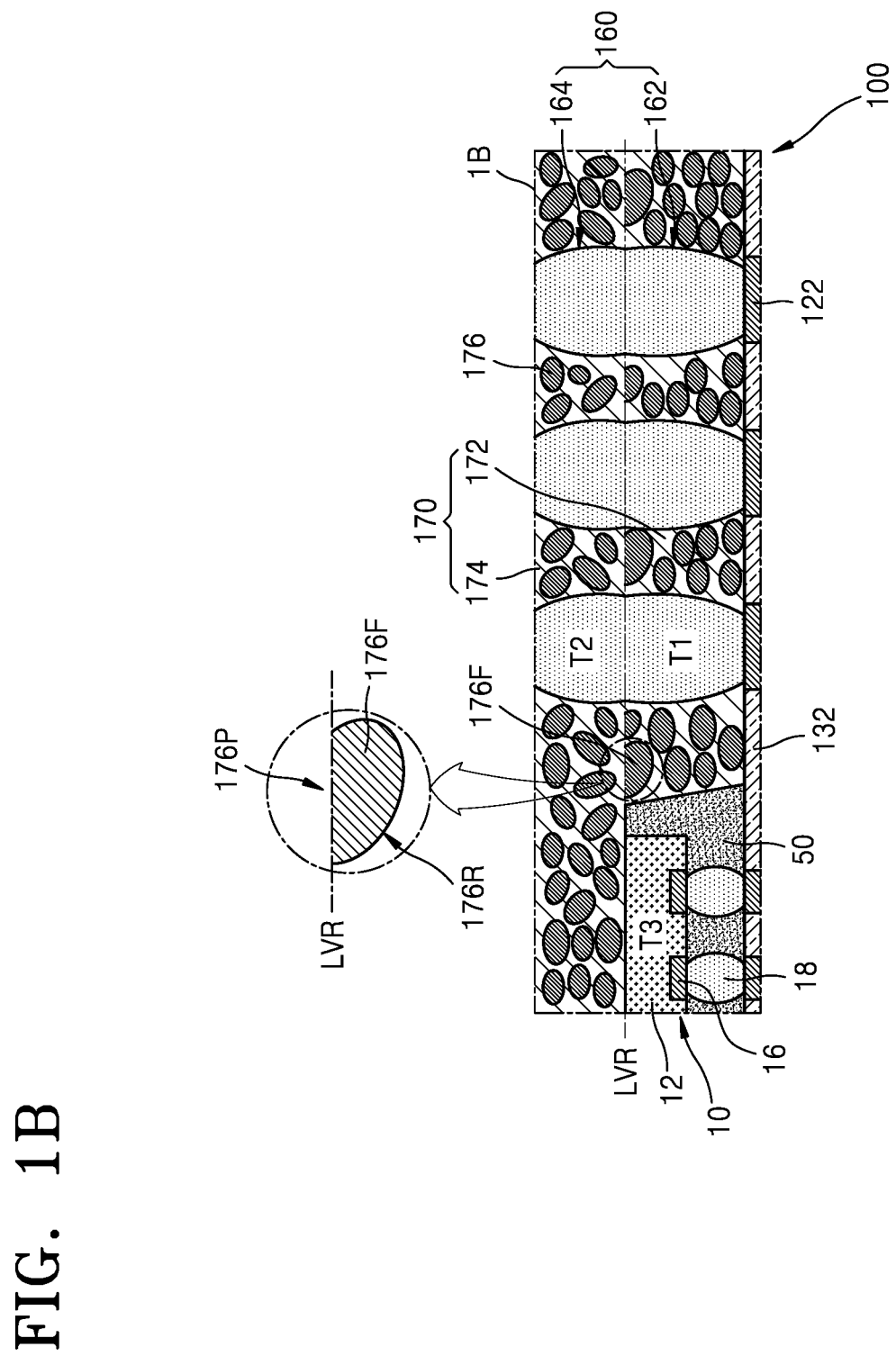
FIG. 1B is an enlarged cross-sectional view of region 1B shown in FIG. 1A.

FIG. 1A is a cross-sectional view of a semiconductor package 1 according to an embodiment of the present inventive concepts, and FIG. 1B is an enlarged cross-sectional view of a region 1B in FIG. 1A.

Referring to FIGS. 1A and 1B together, the semiconductor package 1 may include a support wiring structure 100, a semiconductor chip 10 on the support wiring structure 100, a filling member 170 surrounding the semiconductor chip 10, a cover wiring structure 200 on the semiconductor chip 10 and the filling member 170, and a plurality of connection structures 160 penetrating the filling member 170 (e.g., in a vertical direction) to extend between the support wiring structure 100 and the cover wiring structure 200 and electrically connecting the support wiring structure 100 to the cover wiring structure 200. In the embodiment of FIG. 1A, the semiconductor package 1 is illustrated as including one semiconductor chip 10, but this is only an example and the embodiments of the present inventive concepts are not limited thereto. For example, in some embodiments, the semiconductor package 1 may include a plurality of semiconductor chips 10.

The semiconductor package 1 may include a fan-out semiconductor package in which each of a horizontal width and a plan area (e.g., in a plane viewed from above the semiconductor package 1) of the support wiring structure 100, and a horizontal width and a plan area of the cover wiring structure 200 has a value greater than each of a horizontal width and a plan area of a footprint of the semiconductor chip 10, respectively. For example, in an embodiment in which the semiconductor package 1 includes one semiconductor chip 10, each of the horizontal width and the plan area of the support wiring structure 100, and the horizontal width and the plan area of the cover wiring structure 200 may be greater than each of the horizontal width and the plan area of one semiconductor chip 10, respectively. In some embodiments, the horizontal widths and the plan areas of the support wiring structure 100 and the cover wiring structure 200 may be the same as each other. However, in some embodiments, the horizontal widths and the plan areas of the support wiring structure 100 and the cover wiring structure 200 may be different from each other. In some embodiments, corresponding lateral side surfaces of the support wiring structure 100, the filling member 170, and the cover wiring structure 200 may be coplanar with each other.

The support wiring structure 100 may be referred to as a lower wiring structure or a first wiring structure, and the cover wiring structure 200 may be referred to as an upper wiring structure or a second wiring structure.

In an embodiment, the support wiring structure 100 may include, for example, a printed circuit board (PCB), a ceramic substrate, a package manufacturing wafer, an interposer, or a redistribution layer. In some embodiments, the support wiring structure 100 may include a multi-layer PCB. In embodiments in which the support wiring structure 100 includes a PCB, the support wiring structure 100 may be referred to as a support PCB, or a lower PCB, or a first PCB.

The support wiring structure 100 may include at least one first base insulating layer 110 and a plurality of first wiring patterns 120. In an embodiment, the first base insulating layer may include at least one material selected from phenol resin, epoxy resin, and polyimide. The first base insulating layer 110 may include at least one material selected from frame retardant 4 (FR4), tetrafunctional epoxy, polyphenylene ether, epoxy/polyphenylene oxide, bismaleimide triazine (BT), thermount, cyanate ester, polyimide, and liquid crystal polymer. However, embodiments of the present inventive concepts are not limited thereto.

The plurality of first wiring patterns 120 may include a first upper wiring pattern that is disposed on an upper surface of the at least one first base insulating layer 110 and includes a plurality of first upper surface pads 122, a first lower surface wiring pattern that is disposed on a lower surface of the base insulating layer 110 and includes a plurality of first lower surface pads 124, and a plurality of first conductive vias 128 electrically connecting the first wiring patterns 120 that penetrate the at least one first base insulating layer 110 that are on different wiring layers from each other.

As shown in FIG. 1A, in some embodiments in which the support wiring structure 100 includes the plurality of first base insulating layers 110, the first wiring pattern 120 may further include a first internal wiring pattern 126 that forms a wiring layer and is disposed between two adjacent first base insulating layers 110. Each of upper and lower ends of the plurality of first conductive vias 128 may contact any one of a portion of the first upper surface wiring pattern, a portion of the first lower surface wiring pattern, or a portion of the first internal wiring pattern 126. In an embodiment, the first wiring pattern 120 may include at least one compound selected from copper, nickel, stainless steel, and beryllium copper.

A wiring layer may mean an electric path extending on a plane. The support wiring structure 100 may have wiring layers disposed on the upper and lower surfaces of the at least one first base insulating layer 110. Accordingly, the number of support wiring structures 100 may be one more than the number of the first base insulating layers 110.

In the present Specification, the upper surface of the at least one first base insulating layer 110 and the lower surface of the at least one first base insulating layer 110 may mean the upper and lower surfaces of the first base insulating layer 110 in embodiments in which the support wiring structure 100 includes one first base insulating layer 110. In embodiments in which the support wiring structure 110 includes a plurality of first base insulating layers 110, the upper surface of the at least one first base insulating layer 110 and the lower surface of the at least one first base insulating layer 110 may mean the upper surface of the uppermost first base insulating layer 110 and the lower surface of the lowermost first base insulating layer 110 among the plurality of first base insulating layers 110.

The support wiring structure 100 may further include a first solder resist layer 130 disposed on upper and lower surfaces thereof. As shown in the embodiment of FIG. 1A, the first solder resist layer 130 may include a first upper surface solder resist layer 132 that covers the upper surface of the at least one first base insulating layer 110 and exposes the first upper pad 122 among the first upper surface wiring patterns, and a first lower surface solder resist layer 134 that covers the lower surface of the at least one first base insulating layer 110 and exposes the first lower surface pad 124 among the first lower surface wiring patterns.

In some embodiment, the semiconductor package 1 may include the first lower surface solder resist layer 134 covering the lower surface of the at least one first base insulating layer 110 and may not include the first upper surface solder resist layer 132 covering the upper surface of the at least one first base insulating layer 110.

In some embodiments, each of the first upper surface solder resist layer 132 and the first lower surface solder resist layer 134 may be doped on the upper surface and the lower surface of the at least one first base insulating layer 110 by using a screen printing method or an inkjet printing method using a solder mask insulating ink, and then may be formed by using a thermal, ultra-violet (UV), or infra-red (IR) hardening process.

In some other embodiment, each of the first upper surface solder resist layer 132 and the first lower surface solder resist layer 134 may be doped with a photo-imageable solder resist on the entire area of the upper surface and the lower surface of the at least one first base insulating layer 110 by using a screen printing method or a spray coating method, or may be attached to the entire area thereof by using a laminating method of a film-type solder resist material, and then may be formed by removing unnecessary portions of the entire area thereof by using exposure and development, and by hardening the entire area thereof by using a thermal, UV, or IR process.

The semiconductor chip 10 may include a semiconductor substrate 12 on which a semiconductor device 14 is formed on an active surface thereof, and a plurality of chip connection pads 16 disposed on the active surface of the semiconductor substrate 12. In some embodiments in which the semiconductor package 1 is a lower package of a PoP, the semiconductor package 11, the semiconductor chip 10, the semiconductor substrate 12, the semiconductor device 14, and the chip connection pads 16 may be referred to as a first semiconductor package, a first semiconductor chip, a first semiconductor substrate, a first semiconductor device, and a first chip connection pad, respectively, or a lower semiconductor package, a lower semiconductor chip, a lower semiconductor substrate, a lower semiconductor device, and a lower chip connection pad, respectively.

In an embodiment, the semiconductor substrate 12 may include, for example, a semiconductor material such as silicon (Si). Alternatively, the semiconductor substrate 12 may include a semiconductor element such as germanium (Ge), or a compound semiconductor such as at least one compound selected from silicon carbide (SiC), gallium arsenide (GaAs), indium arsenide (InAs), and indium phosphide (InP). The semiconductor substrate 12 may include a conductive region, such as a well doped with impurities. The semiconductor substrate 12 may have various device isolation structures such as a shallow trench isolation (STI) structure.

The semiconductor substrate 12 may include the semiconductor device 14 including a plurality of individual elements of various types disposed on the active surface of the semiconductor substrate 12. In an embodiment, the plurality of individual elements may include various microelectronic devices, for example, a metal-oxide-semiconductor field effect transistor (MOSFET) such as a complementary metal-insulator-semiconductor (CMOS) transistor, an image sensor such as a system large scale integration (LSI) image sensor, and CMOS image sensor (CIS), a microelectro-mechanical system (MEMS) image sensor, an active device, a passive device, etc. The plurality of individual elements may be electrically connected to the conductive region of the semiconductor substrate 12. The semiconductor device 14 may further include a conductive wiring or a conductive plug electrically connecting at least two of the plurality of individual elements, or connecting the plurality of individual elements to the conductive region of the semiconductor substrate 12. In addition, each of the plurality of individual elements may be electrically separated from other neighboring individual elements by an insulating layer.

In an embodiment, the semiconductor chip 10 may include, for example, a central processing unit (CPU) chip, a graphics processing unit (GPU) chip, or an application processor (AP) chip. In some embodiments in which the semiconductor package 1 includes a plurality of semiconductor chips 10, some of the plurality of semiconductor chips 10 may include, for example, a dynamic random access memory (RAM) (DRAM) chip, a static (S) RAM (SRAM) chip, a flash memory chip, an electrically erasable and programmable read-only memory (ROM) (EEPROM) chip, a phase-change RAM (PRAM) chip, a magnetic RAM (MRAM) chip, or a resistive RAM (RRAM) chip.

In an embodiment, the semiconductor chip 10 may be mounted on the support wiring structure 100 in a flip chip method. For example, the semiconductor chip 10 may be mounted on the support wiring structure 100 so that the active surface of the semiconductor substrate 12 faces the support wiring structure 100. For example, as shown in the embodiment of FIG. 1A, the chip connection pads 16 may be disposed to face the first wiring patterns 120.

The plurality of chip connection pads 16 of the semiconductor chip 10 electrically connected to the semiconductor device 14 may be electrically connected to the support wiring structure 100. The plurality of chip connection terminals 18 may be disposed between some of the plurality of first upper surface pads 122 and the plurality of chip connection pads 16, and thus, may connect the semiconductor chip 10 to the plurality of first wiring patterns 120 of the support wiring structure 100. For example, in an embodiment, the plurality of chip connection terminals 18 may include solder balls or bumps.

In some embodiment, an under-fill layer 50 surrounding the plurality of chip connection terminals 18 may be disposed between the semiconductor chip 10 and the support wiring structure 100. In an embodiment, the under-fill layer 50 may include, for example, an epoxy resin formed by a capillary under-fill method. In some embodiment, the under-fill layer 50 may cover at least a portion of a side surface of the semiconductor chip 10. In some other embodiments, the under-fill layer 50 may cover side surfaces of the semiconductor chip 10, and the uppermost end of the under-fill layer 50 may be at a reference level LVR that is the same vertical level as an upper surface of the semiconductor chip 10. As shown in the embodiment of FIG. 1A, the under-fill layer 50 may cover lateral side surfaces and portions of the bottom surface of the semiconductor chip 10. For example, the uppermost surface of the under-fill layer 50 and an inactive surface, which is the upper surface of the semiconductor chip 10, may both be positioned at the reference level LVR, which is the same vertical level, and may be coplanar with each other. In some embodiments, the under-fill layer 50 may include a portion of a lower charging unit of a charging member that is described later and formed in a molded under-fill (MUF) method.

The plurality of connection structures 160 may be spaced apart from the semiconductor chip 10 (e.g., in a horizontal direction), and may be positioned around the semiconductor chip 10. In some embodiments, the plurality of connection structures 160 may be spaced apart from each other at a pitch of about 150 μm. However, embodiments of the present inventive concepts are not limited thereto. The plurality of connection structures 160 may penetrate the filling member 170 (e.g., in a vertical direction), and electrically connect the support wiring structure 100 and the cover wiring structure 200. Upper and lower ends of each of the plurality of connection structures 160 may contact and be connected to any one of a plurality of second lower surface pads 224 of the cover wiring structure 200 and any one of a plurality of first top surface pads 112 of the support wiring structure 100. In an embodiment, each of the plurality of connection structures 160 may include at least one of a through mold via (TMV), a conductive solder, a conductive pillar, and a conductive bump.

Each of the plurality of connection structures 160 may include a lower connection unit 162 that has an upper surface positioned at the reference level LVR and which extends below the reference level LVR and an upper connection unit 164 that has a lower surface positioned on the reference level LVR and which extends above the reference level LVR. For example, the reference level LVR may be a boundary between the lower connection unit 162 and the upper connection unit 164. In some embodiments, each of the plurality of connection structures 160 may be formed, by thermally reflowing and soldering to be one body, the lower connection unit 162 that is attached to any one of the plurality of first upper surface pads 122 of the support wiring structure 100 and the upper connection unit 164 that is attached to any one of the plurality of second lower surface pads 224 of the cover wiring structure 200. In an embodiment, the plurality of connection structures 160 may include at least one compound selected from Sn, Bi, Ag, and Zn.

The filling member 170 may fill a space between the support wiring structure 100 and the cover wiring structure 200, and may cover the semiconductor chip 10. The filling member 170 may fill a space between the semiconductor chip 10 and the cover wiring structure 200. For example, the filling member 170 may cover the lateral side and upper surfaces of the semiconductor chip 10. The filling member 170 may cover lateral side surfaces of the plurality of connection structures 160. In an embodiment, the filling member 170 may include an epoxy mold compound (EMC).

The filling member 170 may include the lower filling unit 172 that extends below the reference level LVR and an upper filling unit 174 that extends above the reference level LVR. In some embodiments, the lower filling unit 172 and the upper filling unit 174 may be formed separately, but may not have a separating interface and may be integrated. The lower filling unit 172 may have a first thickness T1 (e.g., length in the vertical direction), and the upper filling unit 174 may have a second thickness T2 (e.g., length in the vertical direction). The first thickness T1 may be a thickness of a portion of the lower connection unit 162 surrounded by the lower filling unit 172, and the second thickness T2 may be a thickness of a portion of the upper connection unit 164 surrounded by the upper filling unit 174. In some embodiments, the first thickness T may be greater than the second thickness T2. For example, the first thickness T1 may be in a range of about 60 μm to about 90 μm, and the second thickness T2 may be in a range of about 40 μm to about 80 μm. The semiconductor chip 10 may have a third thickness T3 (e.g., length in the vertical direction). The third thickness T3 may be less than the first thickness T1. For example, the third thickness T3 may be in a range of about 20 μm to about 50 μm.

The filling member 170 may include a plurality of fillers 176. For example, in an embodiment, the filling member 170 may include an epoxy-based material including the plurality of fillers 176. In some embodiments, a ratio of the plurality of fillers 176 included in the filling member 170 may be in a range of about 55 wt % to about 85 wt %. The filler 176 may include an insulating material. For example, the filler 176 may include a ceramic-based material having non-conductive insulating properties. In some embodiments, the filler 176 may include at least one compound selected from AlN, BN, $Al_2O_3$, SiC, and MgO. For example, the filler 176 may include a silica filler or an alumina filler. An average diameter of the filler 176 may be in a range of about 0.1 μm to several tens of μm. For example, the average diameter of the filler 176 may be about 30 μm.

Surfaces of the plurality of fillers 176 may be generally curved. As shown in the embodiment of FIG. 1B, some of the plurality of fillers 176 may include cutting fillers 176F having a flat surface 176P in a portion of the surfaces of the fillers 176. As shown in the embodiment of FIG. 1B, a portion of the surfaces of the cutting filler 176F may include the flat surface 176P, and the other portion of the surfaces of the cutting filler 176F may include a curved surface 176R. For example, an upper surface of the cutting filler 176F may include the flat surface 176P, and lateral side surfaces and a bottom surface thereof may include the curved surface 176R.

The flat surface 176P of the cutting filler 176F may extend in a horizontal direction. For example, the flat surface 176P of the cutting filler 176F may be aligned with (e.g., coplanar with) the reference level LVR that is the same vertical level as the upper surface of the semiconductor chip 10. The cutting filler 176F may extend below the reference level LVR so that the flat surface 176P, which is the upper surface thereof extends along the reference level LVR. For example, the filling member 170 may be adjacent to the reference level LVR, and may include the cutting filler 176F only in a portion that extends below the reference level LVR.

In an embodiment, the cover wiring structure 200 may include, for example, a PCB, a ceramic substrate, a package manufacturing wafer, or an interposer. In some embodiments, the cover wiring structure 200 may include a multi-layer PCB. In embodiments in which the cover wiring structure 200 includes a PCB, the cover wiring structure 200 may also be referred to as a cover PCB, an upper PCB, or a second PCB.

The cover wiring structure 200 may include at least one second base insulating layer 210 and a plurality of second wiring patterns 220. In an embodiment, the second base insulating layer 210 may include at least one material selected from phenol resin, epoxy resin, and polyimide.

The plurality of second wiring patterns 220 may include a second upper surface wiring pattern disposed on an upper surface of the at least one second base insulating layer 210 and including a plurality of second upper surface pads 222, a second lower surface wiring pattern disposed on the lower surface of at least one second base insulating layer 210 and including a plurality of second lower surface pads 224, and a plurality of second conductive vias 228 penetrating the at least one second base insulating layer 210 (e.g., in a vertical direction) and electrically connecting the second wiring patterns 220 on different wiring layers from each other.

In some embodiments in which the cover wiring structure 200 includes the plurality of second base insulating layers 210, the second wiring pattern 220 may further include a second internal wiring pattern constituting a wiring layer between two adjacent second base insulating layers 210 and may be similar to the first internal wiring pattern 126. Each of the upper and lower ends of the plurality of second conductive vias 228 may contact any one of a portion of the second upper surface wiring pattern, a portion of the second lower surface wiring pattern, or a portion of the second internal wiring pattern. In an embodiment, the second wiring pattern 220 may include at least one compound selected from copper, nickel, stainless steel, and beryllium copper.

In the embodiment of FIG. 1A, it is illustrated that the support wiring structure 100 includes four wiring layers, and the cover wiring structure 200 includes two wiring layers. However, embodiments of the present inventive concepts are not limited thereto and the numbers of the wiring layers on the support wiring structure 100 and the cover wiring structure 200 may vary in other embodiments. In some embodiments, the number of wiring layers included in the support wiring structure 100 may be greater than the number of wiring layers included in the cover wiring structure 200.

The cover wiring structure 200 may further include a second solder resist layer 230 disposed on the upper and lower surfaces thereof. The second solder resist layer 230 may include a second upper surface solder resist layer 232 that covers the upper surface of the at least one second base insulating layer 210 and exposes the second upper pad 222 among the second upper surface wiring patterns, and a second lower surface solder resist layer 234 that covers the lower surface of the at least one second base insulating layer 210 and exposes the second lower surface pad 224 among the second lower surface wiring patterns.

In some embodiments, each of the second upper surface solder resist layer 232 and the second lower surface solder resist layer 234 may be doped with a solder mask insulating ink on the upper surface and the lower surface of the at least one second base insulating layer 210 by using a screen printing method or an inkjet printing method, and then may be formed by using a thermal, ultra-violet (UV), or infra-red (IR) hardening process.

In some embodiments, each of the second upper surface solder resist layer 232 and the second lower surface solder resist layer 234 may be doped entirely with a photo-sensitive solder resist on the upper surface and the lower surface of the at least one second base insulating layer 210 by using a screen printing method or an inkjet printing method, and then may be formed by removing unnecessary portions by exposure and development, and using a thermal, UV, or IR hardening process.

In FIG. 1A, for convenience of illustration, only the first upper surface pad 122 among the first upper surface wiring patterns, only the first lower surface pad 124 among the first lower surface wiring patterns, only the second upper surface pad 222 among the second upper surface wiring patterns, and only the second lower surface pad 224 among the second lower surface wiring patterns are illustrated. However, it may be clearly understood by those of skill in the art that the support wiring structure 100 may further include a portion of the first upper surface wiring pattern extending along a space between the at least one first base insulating layer 110 and the first upper surface solder resist layer 132, and/or a portion of the first lower surface wiring pattern extending along a space between the at least one first base insulating layer 110 and the first lower surface solder resist layer 134 and the cover wire structure 200 may include a portion of the second upper surface wiring pattern extending along a space between the at least one second base insulating layer 210 and the second upper surface solder resist layer 232, and/or a portion of the second lower surface wiring pattern extending along a space between the at least one second base insulating layer 210 and the second lower surface solder resist layer 234.

The semiconductor package 1 may include a plurality of external connection terminals 150 attached to the plurality of first lower surface pads 124. In an embodiment, a height of each of the plurality of external connection terminals 150 may be about 150 μm. However, embodiments of the present inventive concepts are not limited thereto.

FIGS. 2A through 2H are enlarged cross-sectional views of connection structures included in a semiconductor package, according to embodiments of the present inventive concepts. The connection structure 160 illustrated in the embodiments of FIGS. 1A and 1B may be any one of connection structures 160a, 160b, 160c, 160d, 160e, 160f, 160g, and 160h illustrated in the embodiments shown in FIGS. 2A through 2H.

Referring to the embodiment of FIG. 2A, the connection structure 160a may include a lower connection unit 162a having an upper surface positioned at the reference level LVR and which extends below the reference level LVR and an upper connection unit 164a that has a lower surface positioned at the reference level LVR and which extends above the reference level LVR. The filling member 170 may cover lateral side surfaces of the plurality of connection structures 160a. The filling member 170 may include the lower filling unit 172 having an upper surface positioned at the reference level LVR and which extends below the reference level LVR and surrounds the lower connection unit 162a, and may include the upper filling unit 174 having a lower surface positioned at the reference level LVR and which extends above the reference level LVR and surrounds the upper connection unit 164a.

The lower connection unit 162a may have a first horizontal width WLa that is the maximum horizontal width at the reference level LVR, and the upper connection unit 164a may have a second horizontal width WHa that is the maximum horizontal width at the reference level LVR. As shown in the embodiment of FIG. 2A, the first horizontal width WLa may be the same as the second horizontal width WHa. For example, in an embodiment, the connection structure 160a may have an entasis shape (e.g., a convex shape) in which the first horizontal width WLa and the second horizontal width WHa has the maximum horizontal width at the reference level LVR. As shown in the embodiment of FIG. 2A, the curvature of the lateral sides of the lower connection unit 162a may be substantially symmetrical to the curvature of the lateral sides of the upper connection unit 164a.

Referring to the embodiment of FIG. 2B, the connection structure 160b may include a lower connection unit 162a having an upper surface positioned at the reference level LVR and extending below the reference level LVR and an upper connection unit 164b having a lower surface positioned at the reference level LVR and extending above the reference level LVR. The filling member 170 may cover lateral side surfaces of the plurality of connection structures 160b. The filling member 170 may include the lower filling unit 172 having an upper surface positioned at the reference level LVR and which extends below the reference level LVR and surrounds the lower connection unit 162a, and the upper filling unit 174 having a lower surface positioned at the reference level LVR and which extends above the reference level LVR and surrounds the upper connection unit 164b.

The lower connection unit 162a may have a first horizontal width WLa that is the maximum horizontal width at the reference level LVR, and the upper connection unit 164b may have a second horizontal width WHa that is the maximum horizontal width at a first level LV1 that is vertically higher than the reference level LVR and may be below a top surface of the upper connection unit 164b. As shown in the embodiment of FIG. 2B, the second horizontal width WHb may be greater than the first horizontal width WLa. The connection structure 160b may have the second horizontal width WHb as the maximum horizontal width at the first level LV1 that is vertically higher than the reference level LVR. The connection structure 160b may have a dent 160DE having a recessed shape at the reference level LVR.

Referring to the embodiment of FIG. 2C, the connection structure 160c may include a lower connection portion 162a having an upper surface positioned at the reference level LVR and which extends below the reference level LVR and an upper connection portion 164c having a lower surface positioned at the reference level LVR and which extends above the reference level LVR. The filling member 170 may cover lateral side surfaces of the plurality of connection structures 160c. The filling member 170 may include the lower filling unit 172 having an upper surface positioned at the reference level LVR and which extends below the reference level LVR and surrounds the lower connection unit 162a, and the upper filling unit 174 having a lower surface positioned at the reference level LVR and which extends above the reference level LVR and surrounds the upper connection unit 164c.

The lower connection unit 162a may have a first horizontal width WLa that is the maximum horizontal width at the reference level LVR, and the upper connection unit 164c may have a second horizontal width WHc that is the maximum horizontal width at the reference level LVR. As shown in the embodiment of FIG. 2C, the second horizontal width WHc may be greater than the first horizontal width WLa. The connection structure 160c may have the second horizontal width WHc that is a maximum horizontal width at the reference level LVR. The connection structure 160c may include an eave unit 164EV adjacent to the reference level LVR. In some embodiments, the connection structure 160c may include the eave unit 164EV completely surrounding the connection structure 160c at the reference level LVR. For example, the connection structure 160c may have a shape in which an upper connection unit 164c having a relatively larger size is disposed on the lower connection unit 162a having a relatively smaller size. A bottom surface of the eave unit 164EV may be substantially planar and extend along the reference level LVR.

Referring to the embodiment of FIG. 2D, the connection structure 160d may include a lower connection unit 162a having an upper surface positioned at the reference level LVR and which extends below the reference level LVR and an upper connection unit 164d that has a lower surface positioned at the reference level LVR and which extends above the reference level LVR. The filling member 170 may cover lateral side surfaces of the plurality of connection structures 160d. The filling member 170 may include the lower filling unit 172 having an upper surface positioned at the reference level LVR and which extends below the reference level LVR and surrounds the lower connection unit 162a, and the upper filling unit 174 having a lower surface positioned at the reference level LVR and which extends above the reference level LVR and surrounds the upper connection unit 164d.

The lower connection unit 162a may have a first horizontal width WLa that is the maximum horizontal width at the reference level LVR, and the upper connection unit 164d may have a second horizontal width WHd that is the maximum horizontal width at the reference level LVR. As shown in the embodiment of FIG. 2D, the second horizontal width WHd may be greater than the first horizontal width WLa. The connection structure 160d may have the second horizontal width WHd that is a maximum horizontal width at the reference level LVR. The connection structure 160d may include an eave unit 164EVa adjacent to the reference level LVR. The connection structure 160d may include the eave unit 164EVa that surrounds only a partial portion of the connection structure 160d at the reference level LVR. For example, the connection structure 160d may have a shape in which an upper connection unit 164d having a relatively larger size is on the lower connection unit 162a having a relatively smaller size. A bottom surface of the eave unit 164EVa may extend along the reference level LVR. For example, at the reference level LVR, a partial portion of a lateral edge of the lower connection unit 162a and a partial portion of a lateral edge of the upper connection unit 164d may contact each other, and the remaining portion of the lateral edge of the lower connection unit 162a and remaining portion of the lateral edge of the upper connection unit 164d may not contact each other. Accordingly, at the reference level LVR, a partial portion of a sidewall of the lower connection unit 162a and a partial portion of a sidewall of the upper connection unit 164d may be connected to each other, and a remaining portion of the sidewall of the lower connection unit 162a where the eave unit 164EVa is disposed and a remaining portion of the sidewall of the upper connection unit 164d may not be connected to each other.

Referring to the embodiment of FIG. 2E, the connection structure 160e may include a lower connection unit 162b having an upper surface positioned at the reference level LVR and which extends below the reference level LVR and an upper connection unit 164a having a lower surface positioned at the reference level LVR and extending above the reference level LVR. The filling member 170 may cover lateral side surfaces of the plurality of connection structures 160e. The filling member 170 may include the lower filling unit 172 having an upper surface positioned at the reference level LVR and which extends below the reference level LVR and surrounds the lower connection unit 162b, and the upper filling unit 174 having a lower surface positioned at the reference level LVR and which extends above the reference level LVR and surrounds the upper connection unit 164a.

The lower connection unit 162b may have a first horizontal width WLb that is a maximum horizontal width at a second level LV2 that is vertically lower than the reference level LVR and may be above a lower surface of the lower connection unit 162b, and the upper connection unit 164a may have a second horizontal width WHa that is a maximum horizontal width at the reference level LVR. As shown in the embodiment of FIG. 2E, the first horizontal width WLb may be greater than the second horizontal width WHa. The connection structure 160e may have a dent 160DEa having a recessed shape at the reference level LVR.

Referring to the embodiment of FIG. 2F, the connection structure 160f may include a lower connection unit 162b having an upper surface positioned at the reference level LVR and extending below the reference level LVR and an upper connection unit 164b having a lower surface positioned at the reference level LVR and extending above the reference level LVR. The filling member 170 may cover lateral side surfaces of the plurality of connection structures 160f. The filling member 170 may include the lower filling unit 172 having an upper surface positioned at the reference level LVR and which extends below the reference level LVR and surrounds the lower connection unit 162b, and the upper filling unit 174 having a lower surface positioned at the reference level LVR and which extends above the reference level LVR and surrounds the upper connection unit 164b.

The lower connection unit 162b may have a first horizontal width WLb that is a maximum horizontal width at a second level LV2 that is vertically lower than the reference level LVR and may be above a lower surface of the lower connection unit 162b, and the upper connection unit 164b may have a second horizontal width WHb that is a maximum horizontal width at a first level LV1a that is vertically higher than the reference level LVR and may be below an upper surface of the upper connection unit 164b. As shown in the embodiment of FIG. 2F, the first horizontal width WLb may be the same as the second horizontal width WHb. However, embodiments of the present inventive concepts are not limited thereto. For example, in some embodiments, the first horizontal width WLb may be greater than the second horizontal width WHb. In some other embodiment, the first horizontal width WLb may be less than the second horizontal width WHb. The connection structure 160e may have the maximum horizontal width at the first level LV1a, which is a vertical level higher than the reference level LVR, and/or the second level LV2, which is a vertical level lower than the reference level LVR. The connection structure 160f may have a snowman shape having a dent unit 160DEb having a recessed shape at the reference level LVR. As shown in the embodiment of FIG. 2F, in some embodiments in which the first horizontal width WLb and the second horizontal width WHb are equal to each other, the curvature of the lateral sides of the lower connection unit 162b may be substantially symmetrical to the curvature of the lateral sides of the upper connection unit 164b.

Referring to the embodiment of FIG. 2G, the connection structure 160g may include a lower connection unit 162b having an upper surface positioned at the reference level LVR and extending below the reference level LVR and an upper connection unit 164c having a lower surface positioned at the reference level LVR and extending above the reference level LVR. The filling member 170 may cover lateral side surfaces of the plurality of connection structures 160g. The filling member 170 may include the lower filling unit 172 having an upper surface positioned at the reference level LVR and which extends below the reference level LVR and surrounds the lower connection unit 162b, and the upper filling unit 174 having a lower surface positioned at the reference level LVR and which extends above the reference level LVR and surrounds the upper connection unit 164c.

The lower connection unit 162b may have a first horizontal width WLb that is a maximum horizontal width at a second level LV2 that is vertically lower than the reference level LVR and may be above a lower surface of the lower connection unit 162b, and the upper connection unit 164a may have a second horizontal width WHc that is a maximum horizontal width at the reference level LVR. As shown in the embodiment of FIG. 2G, the second horizontal width WHc may be greater than the first horizontal width WLb. The connection structure 160g may have the second horizontal width WHc that is a maximum horizontal width at the reference level LVR. The connection structure 160g may include an eave unit 164EV adjacent to the reference level LVR. In some embodiments, the connection structure 160g may include the eave unit 164EV completely surrounding the connection structure 160g at the reference level LVR. For example, the connection structure 160g may have a shape in which an upper connection unit 164c having a relatively larger size is disposed on the lower connection unit 162b having a relatively smaller size. A bottom surface of the eave unit 164EV may extend along the reference level LVR.

Referring to the embodiment of FIG. 2H, the connection structure 160h may include a lower connection unit 162b having an upper surface positioned at the reference level LVR and extending below the reference level LVR and an upper connection unit 164d having a lower surface positioned at the reference level LVR and extending above the reference level LVR. The filling member 170 may cover lateral side surfaces of the plurality of connection structures 160h. The filling member 170 may include the lower filling unit 172 having an upper surface positioned at the reference level LVR and which extends below the reference level LVR and surrounds the lower connection unit 162b, and the upper filling unit 174 having a lower surface positioned at the reference level LVR and which extends above the reference level LVR and surrounds the upper connection unit 164d.

The lower connection unit 162b may have a first horizontal width WLb that is a maximum horizontal width at a second level LV2 that is vertically lower than the reference level LVR and may be above a lower surface of the lower connection unit 162b, and the upper connection unit 164a may have a second horizontal width WHd that is a maximum horizontal width at the reference level LVR. As shown in the embodiment of FIG. 2H, the second horizontal width WHd may be greater than the first horizontal width WLb. The connection structure 160h may have the second horizontal width Wild that is a maximum horizontal width at the reference level LVR. The connection structure 160h may include an eave unit 164Eva adjacent to the reference level LVR. The connection structure 160h may include the eave unit 164EVa that surrounds only a partial portion of the connection structure 160h at the reference level LVR. For example, the connection structure 160h may have a shape in which an upper connection unit 164d having a relatively larger size is on the lower connection unit 162b having a relatively smaller size. A bottom surface of the eave unit 164EVa may extend along the reference level LVR. For example, at the reference level LVR, a partial portion of a lateral edge of the lower connection unit 162b and a partial portion of a lateral edge of the upper connection unit 164d may contact each other, and the remaining portion of the lateral edge of the lower connection unit 162b and remaining portion of the lateral edge of the upper connection unit 164d may not contact each other. Accordingly, at the reference level LVR, a partial portion of a sidewall of the lower connection unit 162b and a partial portion of a sidewall of the upper connection unit 164d may be connected to each other, and a remaining portion of the sidewall of the lower connection unit 162b where the eave unit 164Eva is arranged and a remaining portion of the sidewall of the upper connection unit 164d may not be connected to each other.

FIGS. 3A through 3J are cross-sectional views illustrating a manufacturing method of a semiconductor package, according to embodiments of the present inventive concept. In FIGS. 3A through 3J, the same reference numerals as those in the embodiments of FIGS. 1A and 1B may denote the same components, and duplicate descriptions thereof may be omitted for convenience of explanation.

Figure 3A:
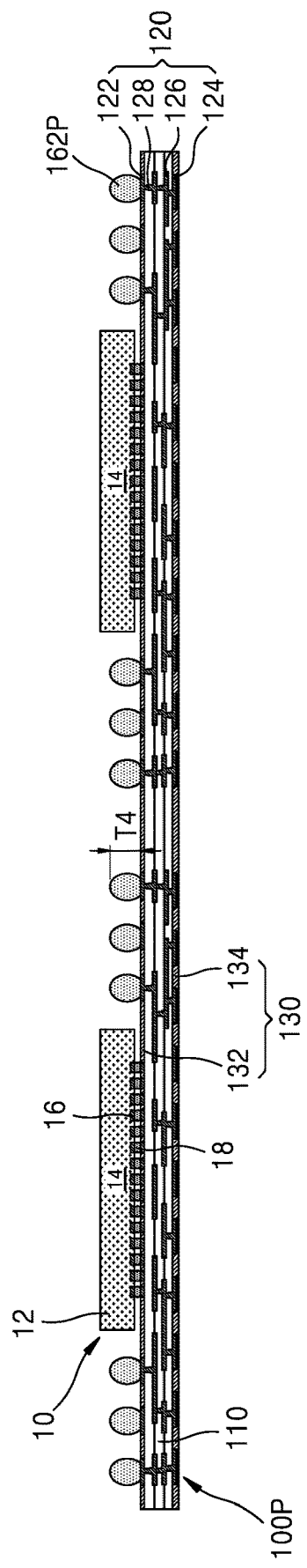
FIGS. 3A through 3J are cross-sectional views illustrating in sequence a manufacturing method of a semiconductor package, according to embodiments of the present inventive concept.

Referring to the embodiment of FIG. 3A, the plurality of semiconductor chips 10 and a plurality of lower conductive solders 162P may be attached onto a support wiring structure array 100P. In an embodiment, the lower conductive solder 162P may include at least one compound selected from Sn, Bi, Ag, and Zn. The lower conductive solder 162P may have a fourth thickness T4 (e.g., length in the vertical direction). The fourth thickness T4 may be greater than the fust thickness T1 illustrated in FIG. 1A. For example, in an embodiment the fourth thickness T4 may be in a range of about 100 μm to about 180 μm.

The support wiring structure array 100P may include an array PCB. In the present Specification, the support wiring structure array 100P may mean that a plurality of support wiring structures 100 illustrated in FIG. 1A are connected to each other and form a relatively large array.

In an embodiment, the plurality of semiconductor chips 10 may be mounted on the support wiring structure array 100P in a flip chip method. For example, the plurality of semiconductor chips 10 may be mounted on the support wiring structure array 100P so that the active surface of the semiconductor substrate 12 faces the support wiring structure array 100P. The plurality of chip connection pads 16 of the semiconductor chip 10 electrically connected to the semiconductor device 14 may be electrically connected to the support wiring structure array 100P. The plurality of chip connection terminals 18 may be disposed between some of the plurality of first upper surface pads 122 and the plurality of chip connection pads 16, and thus, may electrically connect the semiconductor chip 10 to the plurality of first wiring patterns 120 of the support wiring structure array 100P. For example, the plurality of chip connection terminals 18 may include solder balls or bumps.

Figure 3B:
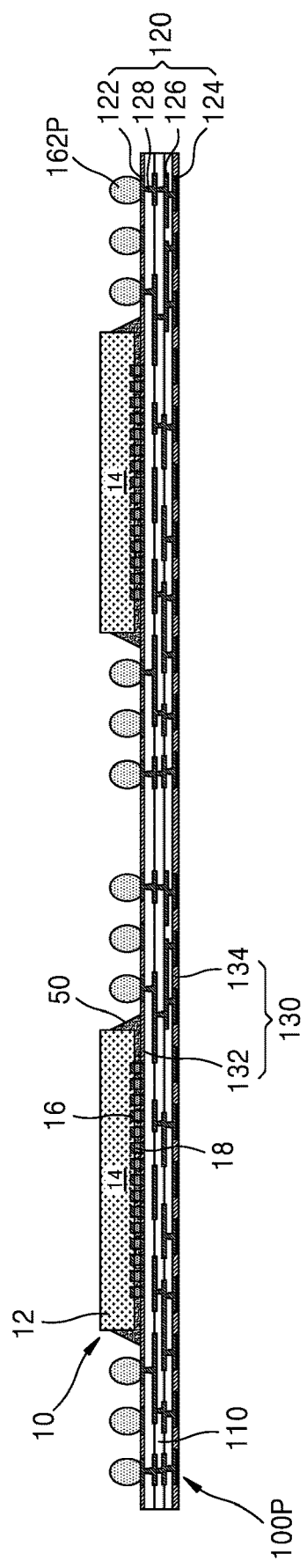

Referring to the embodiment of FIG. 3B, the under-fill layer 50 surrounding the plurality of chip connection terminals 18 may be formed between the semiconductor chip 10 and the support wiring structure array 100P. In an embodiment, the under-fill layer 50 may be formed by, for example, a capillary under-fill method. However, embodiments of the present inventive concepts are not limited thereto. For example, in some embodiments, the under-fill layer 50 may not be formed and may be omitted from the support wiring structure array 100P.

Figure 3C:
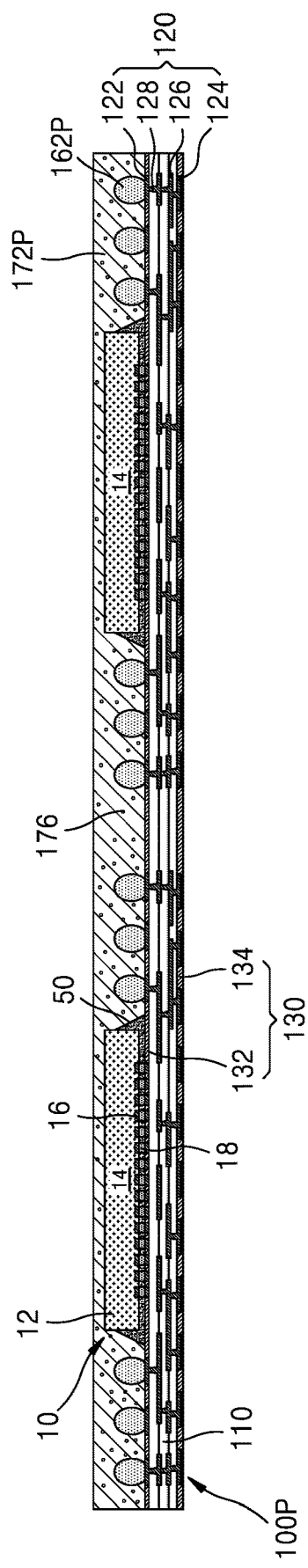

Referring to FIG. 3C, a preliminary filling member 172P surrounding the plurality of semiconductor chips 10 and the plurality of lower conductive solders 162P may be formed on the support wiring structure array 100P. In an embodiment, the preliminary filling member 172P may include an EMC. The preliminary filling member 172P may include the plurality of fillers 176.

As shown in the embodiment of FIG. 3C, the preliminary filling member 172P may be formed to have an upper surface having a vertical level that is higher than the upper surface of the plurality of semiconductor chips 10 and an upper surface of the plurality of lower conductive solders 162P so that the plurality of semiconductor chips 10 and the plurality of lower conductive solders 162P are all covered by the preliminary filling member 172P.

In some embodiments in which the under-fill layer 50 is not formed, the preliminary filling member 172P may be formed by using an MUF method so that the preliminary filling member 172P (e.g., a preliminary charging member) surrounds the plurality of chip connection terminals 18 between the semiconductor chip 10 and the support wiring structure array 100P.

Figure 3D:
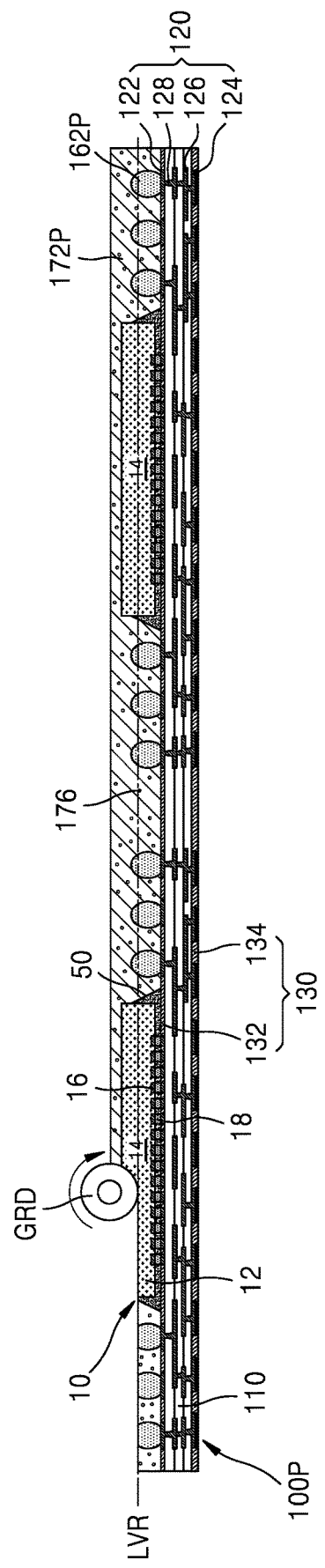

Referring to the embodiments of FIG. 3D, a portion of an upper side of the preliminary filling member 172P, a portion of an upper side of the plurality of semiconductor chips 10, and a portion of an upper side of the plurality of lower conductive solders 162P may be removed. For example, in an embodiment, a portion of the upper side of the preliminary filling member 172P, a portion of the upper side of the plurality of semiconductor chips 10, and a portion of the upper side of the plurality of lower conductive solders 162P may be removed by using a mold grinding process using a grinder GRD.

In some embodiments, in the process of removing a portion of the upper side of the preliminary filling member 172P, a portion of the upper side of the plurality of semiconductor chips 10, and a portion of the upper side of the plurality of lower conductive solders 162P, a portion of an upper side of the under-fill layer 50 may also be removed.

Figure 3E:
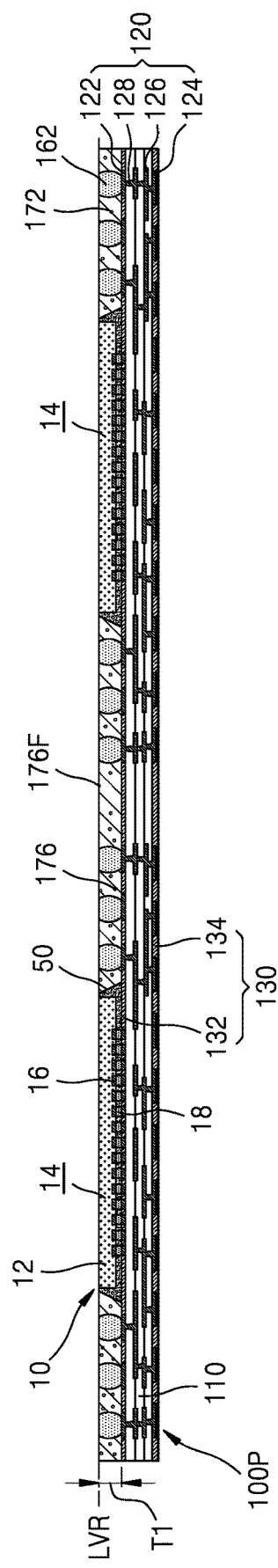

Referring to the embodiments of FIGS. 3D and 3E together, by removing a portion of the upper side of the preliminary filling member 172P and a portion of the upper side of the plurality of lower conductive solders 162P, the lower filling unit 172 and the plurality of lower connection units 162 may be formed, respectively. The lower filling unit 172 may surround the lateral side surfaces of the plurality of semiconductor chips 10 and the plurality of lower connection units 162. The lower filling unit 172 may have the first thickness T1 (e.g., length in the vertical direction).

The upper surfaces of each of the lower filling unit 172, the plurality of semiconductor chips 10 from which a portion of the upper side thereof has been removed, and the plurality of lower connection units 162 may be coplanar with each other and positioned at the reference level LVR.

In some embodiments, the under-fill layer 50 may cover the side surface of the semiconductor chip 10, and the uppermost end of the under-fill layer 50 may be at the reference level LVR. For example, the uppermost surface of the under-fill layer 50 may be coplanar at the same vertical level, such as the reference level LVR, with an upper surface of the lower filling unit 172, the upper surface of the plurality of semiconductor chips 10, and an upper surface of the plurality of lower connection units 162.

In a process of removing a portion of the upper side of the preliminary filling member 172P, some of the plurality of fillers 176 contained in the preliminary filling member 172P, which are located across the reference level LVR, may be removed together with the portion of the upper side of the preliminary filling member 172P, and as illustrated in the embodiment of FIG. 1B, may become the cutting filler 176F having the flat surface 176P aligned along the reference level LVR.

In embodiments in which a portion of the upper side of the lower conductive solder 162P to be removed includes a portion having the maximum horizontal width of the lower conductive solder 162P, the lower connection unit 162a may be formed to have a maximum horizontal width at the reference level LVR as illustrated in the embodiments of FIGS. 2A through 2D. In embodiments in which a portion of the upper side of the lower conductive solder 162P to be removed does not include a portion having the maximum horizontal width of the lower conductive solder 162P, the lower connection unit 162b may be formed to have a maximum horizontal width at any level below the reference level LVR, such as the second level LV2 as illustrated in the embodiments of FIGS. 2E through 2H.

Figure 3F:
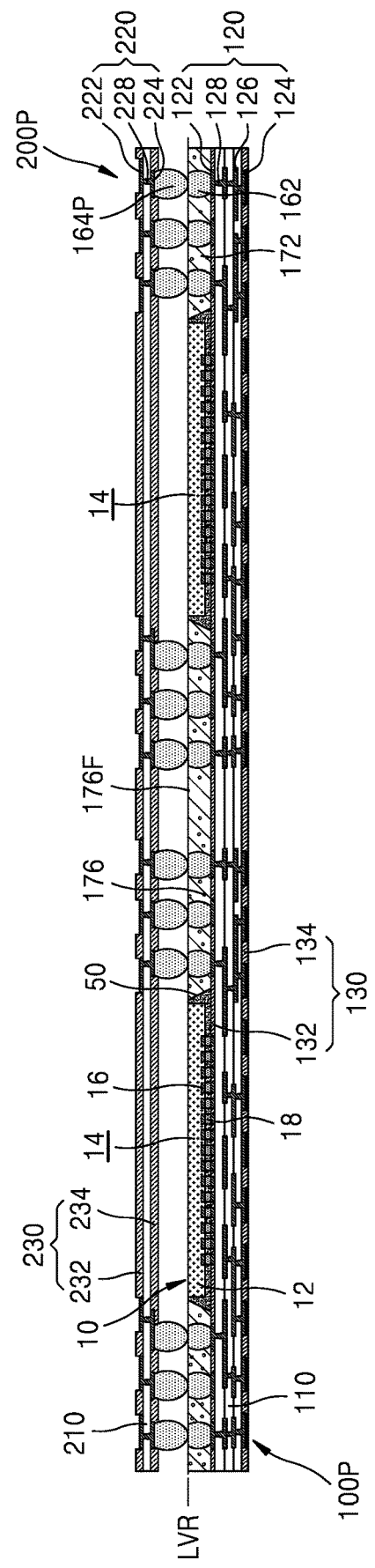

Referring to FIG. 3F, a cover wiring structure array 200P in which a plurality of upper conductive solders IMP are attached to the plurality of second lower surface pads 224 may be prepared. In an embodiment, the upper conductive solder 164P may include at least one material selected from Sn, Bi, Ag, and Zn.

The cover wiring structure array 200P may include an array PCB. For example, the cover wiring structure array 200P may mean that the plurality of cover wiring structures 200 illustrated in FIG. 1A are connected to each other and form a large array.

On the support wiring structure array 100P in which the plurality of semiconductor chips 10 are disposed, the cover wiring structure array 200P may be arranged so that the plurality of lower connection units 162 and the lower filling unit 172 correspond to each other.

Figure 3G:
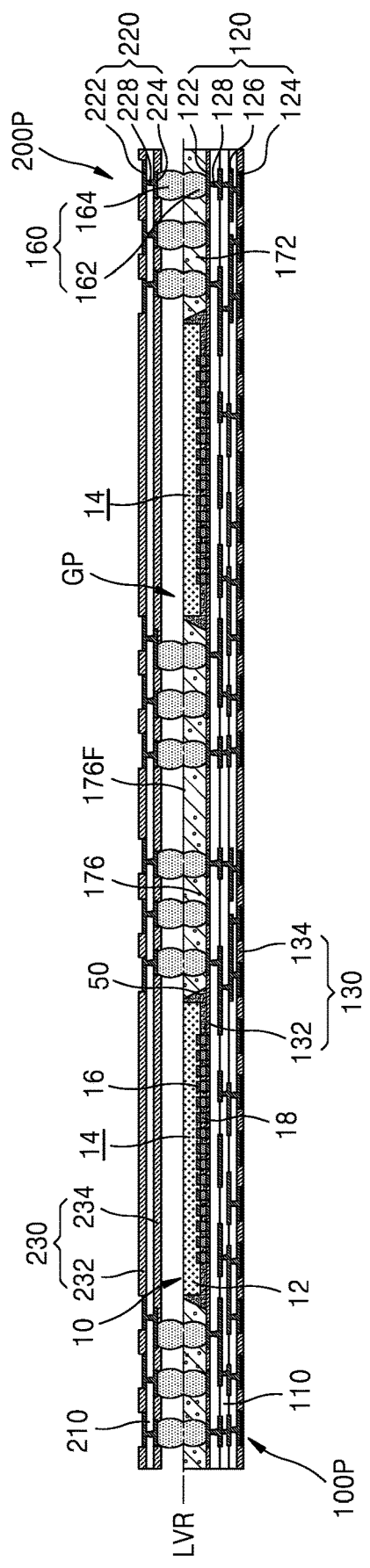

Referring to the embodiments of FIGS. 3F and 3G together, by performing a reflow process, the plurality of lower connection units 162 and the plurality of upper conductive solder 164P, which correspond to each other, may be soldered to become one body, and accordingly, the plurality of connection structure 160 including the lower connection unit 162 and the upper connection unit 164 may be formed.

As shown in FIG. 3G, a gap GP may be formed between the lower filling unit 172 and the support wiring structure array 200P due to the plurality of upper connection units 164.

Figure 2A:
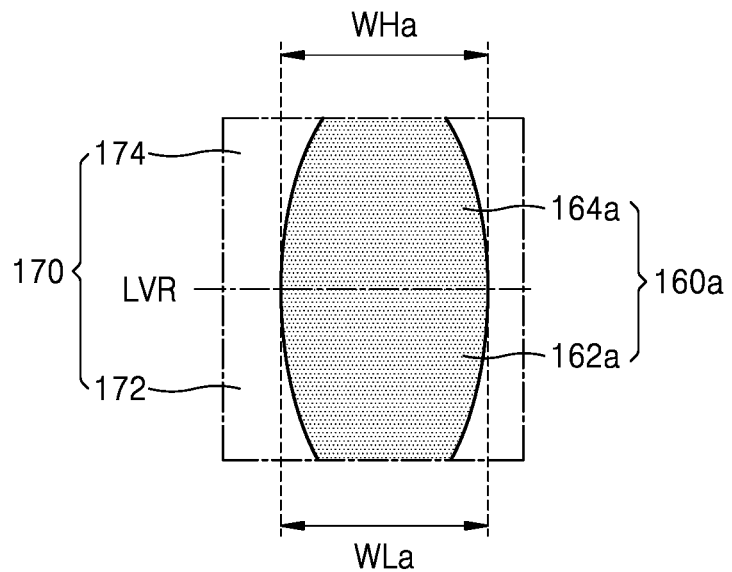
FIGS. 2A through 2H are enlarged cross-sectional views of connection structures included in a semiconductor package, according to embodiments of the present inventive concept.
Figure 2B:
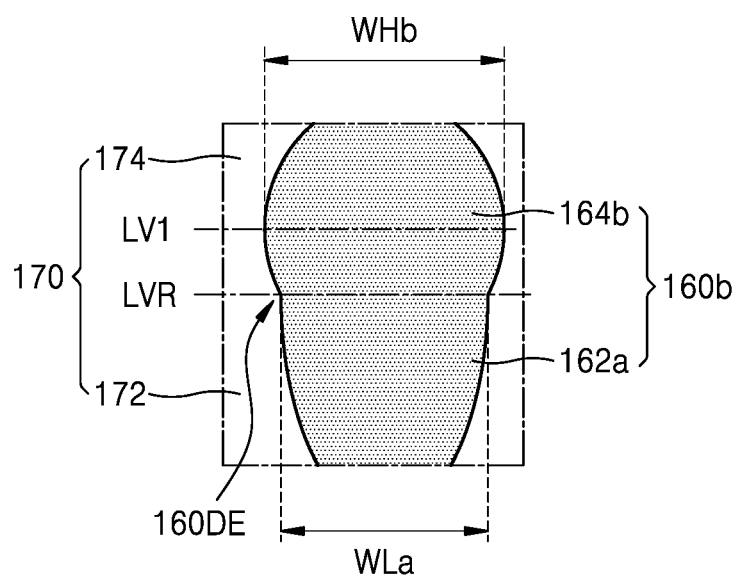
Figure 2C:
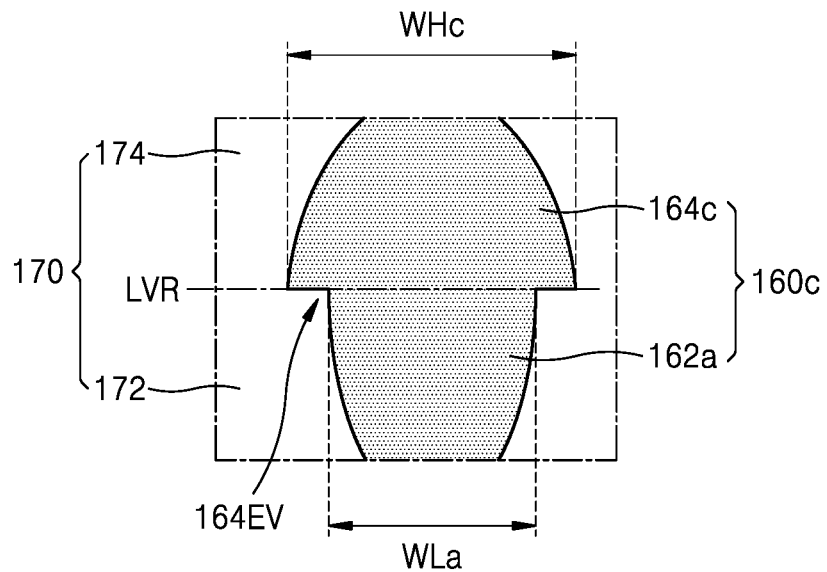
Figure 2D:
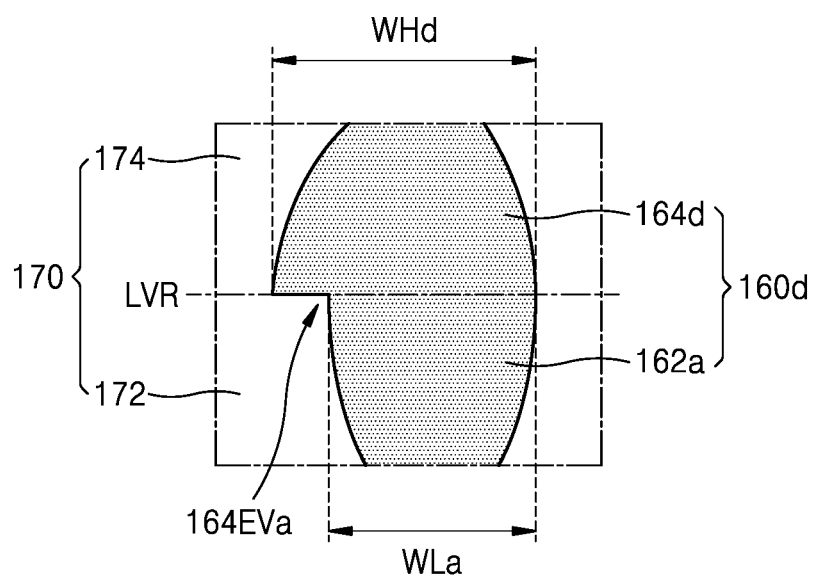
Figure 2E:
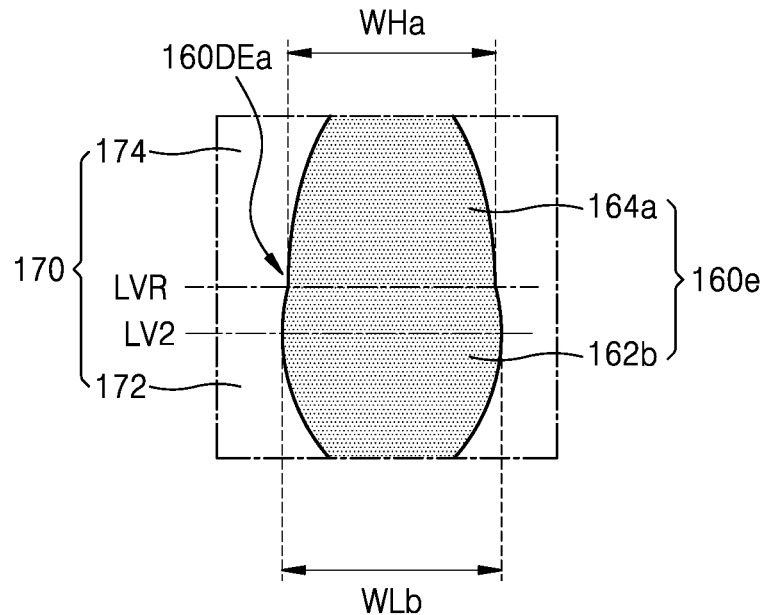
Figure 2F:
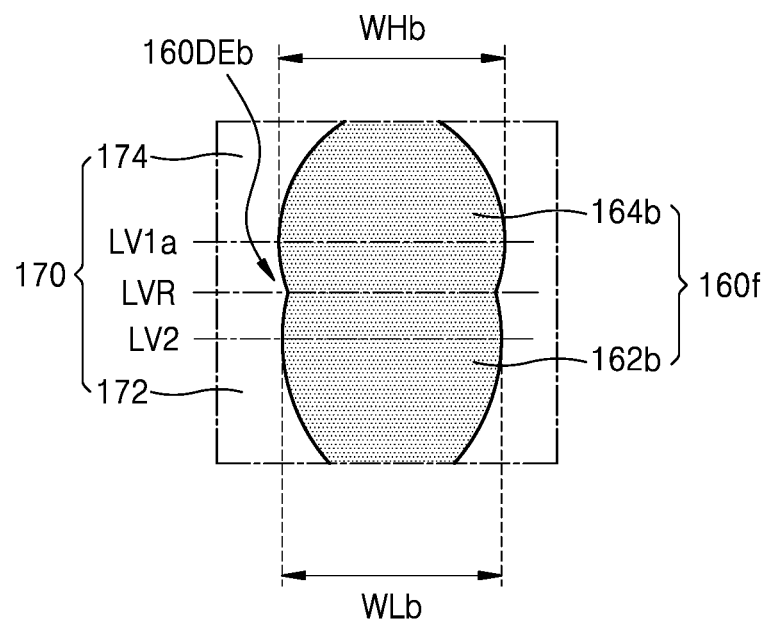
Figure 2G:
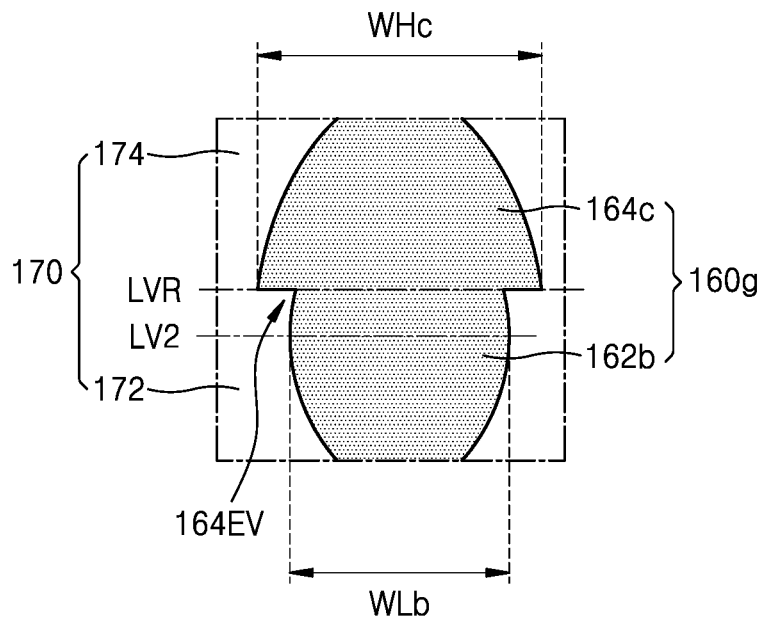
Figure 2H:
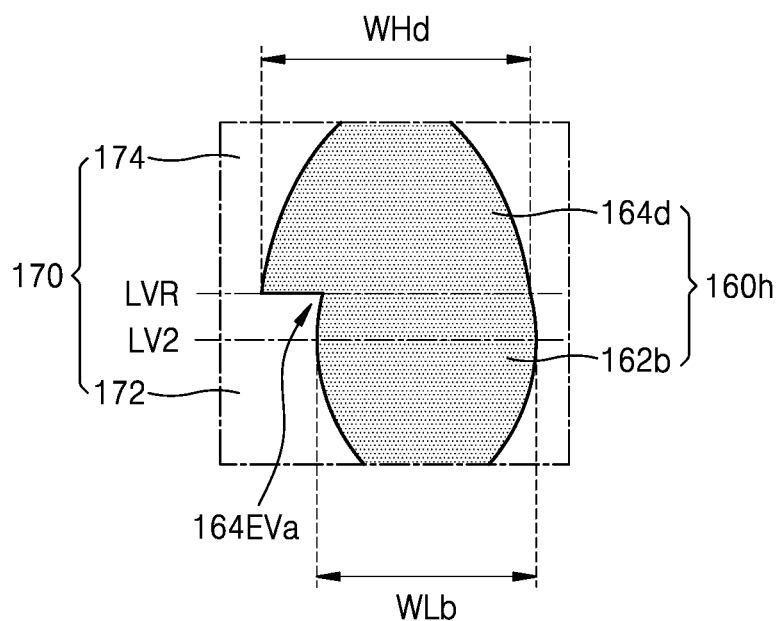

In the process of performing the reflow process, in embodiments in which a volume of the upper conductive solder 164P is relatively small, the upper connection unit 164a illustrated in the embodiments of FIGS. 2A and 2E may be formed. In the process of performing the reflow process, in embodiments in which the volume of the upper conductive solder 164P is relatively large, the upper connection unit 164b illustrated in the embodiments of FIGS. 2B and 2F may be formed. In the process of performing the reflow process, in embodiments in which the volume of the upper conductive solder 164P is relatively large, the upper connection unit 164c including the eave unit 164EV may be formed as illustrated in the embodiments of FIGS. 2C and 2G. In the process of performing the reflow process, in embodiments in which the volume of the upper conductive solder 164P is relatively large and there is some misalignment between the lower connection part 162 and the upper conductive solder 164P, as illustrated in the embodiments of FIGS. 2D and 2H, the upper connection portion 164d including the eave unit 164EVa may be formed.

Figure 3H:
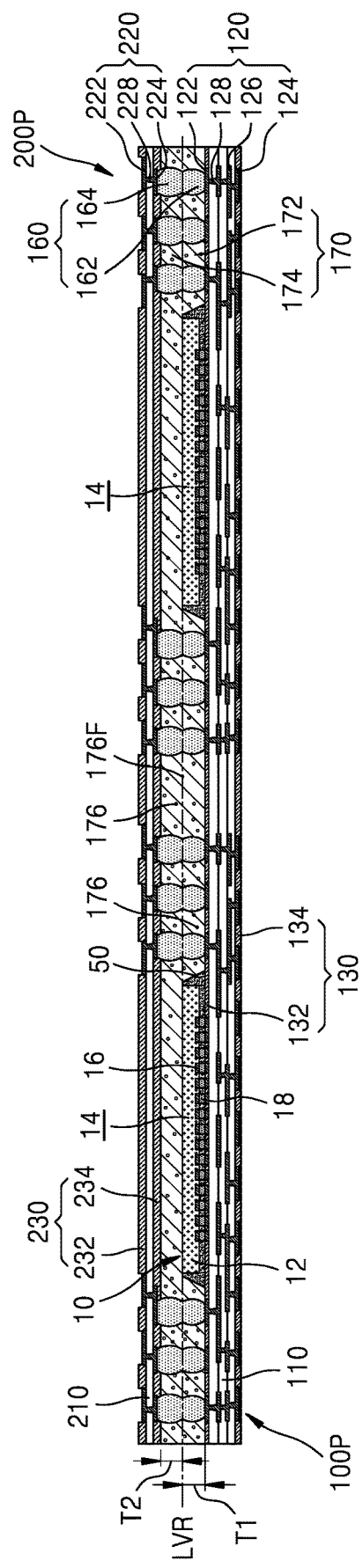

Referring to the embodiment of FIG. 3H, by forming the upper filling unit 174 filling the gap GP illustrated in FIG. 3G, the filling member 170 including the lower filling unit 172 and the upper filling unit 174 may be formed. In an embodiment, the upper filling unit 174 may include the same material as the lower filling unit 172, and the upper filling unit 174 may also contain the plurality of fillers 176. Since the lower filling unit 172 is formed, as illustrated in the embodiments of FIGS. 3C through 3E, by forming the preliminary filling member 172P and then removing a portion of the upper side thereof, the lower filling unit 172 may contain the cutting filler 176F having the flat surface 176P illustrated in FIG. 1B. However, since the upper filling unit 174 is formed to fill the gap GP, the upper filling unit 174 may not contain the cutting filler 176F. For example, the filling member 170 may be adjacent to the reference level LVR, and contain the cutting filler 176F only in a portion under the reference level LVR.

The upper filling unit 174 may surround the plurality of upper connection units 164 and fill the gap GP, illustrated in the embodiment of FIG. 3G, that is a space between the lower filling unit 172 and the semiconductor chip 10, and the cover wiring structure array 200P. The upper filling unit 174 may have the second thickness T2. In some embodiments, the second thickness T2 may be less than the first thickness T1.

Figure 3I:
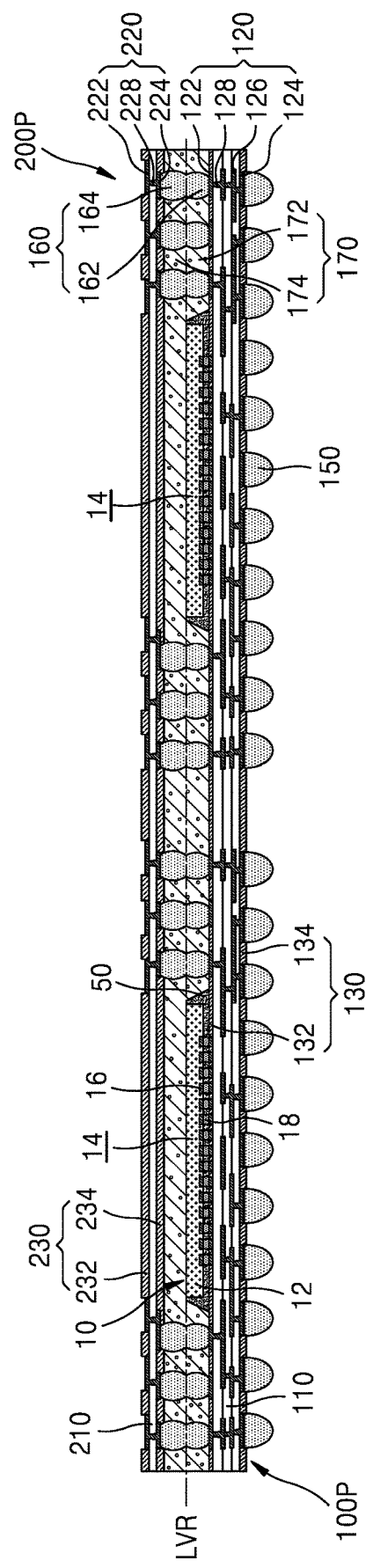

Referring to the embodiment of FIG. 3I, the plurality of external connection terminals 150 may be attached to the plurality of first lower surface pads 124. For example, in an embodiment the plurality of external connection terminals 150 may include solder balls.

Figure 3J:
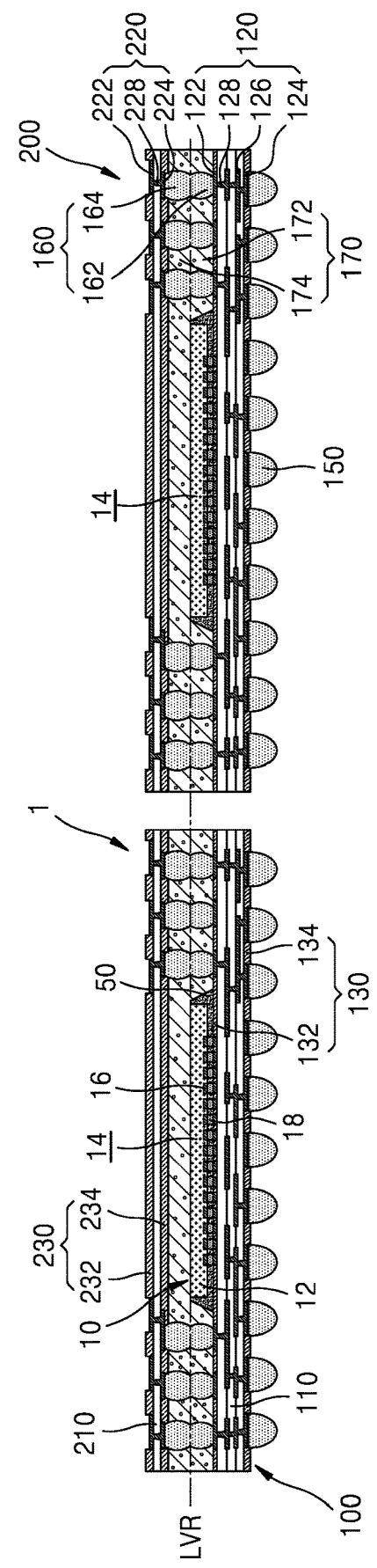

Referring to the embodiments of FIGS. 3I and 3J together, the plurality of semiconductor packages 1 may be formed by individualizing the support wiring structure array 100P and the cover wiring structure array 200P into the support wiring structure 100 and the cover wiring structure 200, respectively.

Referring to the embodiments of FIGS. 3A through 3J together, after forming the plurality of lower connection units 162 having a flat upper surface by removing a portion of the upper side of the plurality of lower conductive solders 162P, and arranging the plurality of upper conductive solders 164P attached to the cover wiring structure array 200P on the plurality of lower connection units 162, the plurality of connection structures 160 may be formed by performing a reflow process.

When a reflow process is to be performed after arranging the plurality of upper conductive solders 14P attached to the cover wiring structure array 200P on the plurality of lower conductive solders 162P in a state where the portion of the upper side of the plurality or lower conductive solders 162P have not been removed, since the upper end of the plurality of lower conductive solders 162P may have an upwardly convex shape, the upper conductive solder 164P and the lower conductive solder 162P corresponding to each other may be easily broken. Accordingly, even when the reflow process is performed, the soldering process in which the upper conductive solder 164P and the lower conductive solder 162P are to be integrally formed may not be performed, and thus, a short failure may occur in which the support wiring structure 100 and the cover wiring structure 200 included in the semiconductor package 1 are not electrically connected.

However, in the semiconductor package 1 according to the present inventive concepts, since the plurality of upper conductive solders 164P are arranged on the plurality of lower connection units 162 that are surrounded by the lower filling unit 172 and have a flat upper surface, the alignment between the lower connection unit 162 and the upper conductive solder 164P corresponding to each other may be easily maintained. Therefore, a short defect may not occur in which the support wiring structure 100 and the cover wiring structure 200 included by the semiconductor package 1 are not electrically connected to each other.

In addition, since the semiconductor package 1 according to the present inventive concepts is formed by removing a portion of the upper side of the preliminary filling member 172P, a portion of the upper side of the plurality of semiconductor chips 10, and a portion of the upper side of the plurality of lower conductive solders 162P, the semiconductor package 1 may be formed to be thin and have a reduced overall height.

Figure 4A:
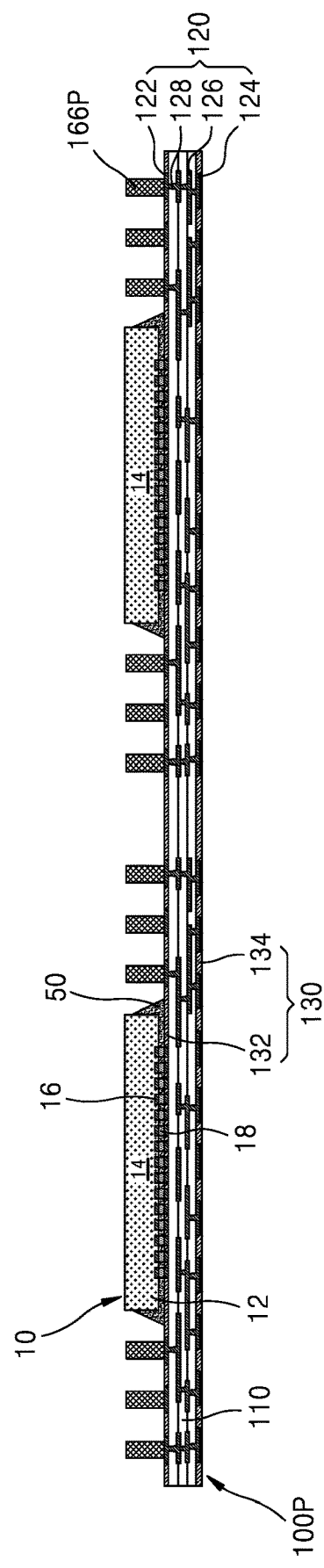
FIG. 4A is a cross-sectional view illustrating a manufacturing method of a semiconductor package, according to an embodiment of the present inventive concepts.
Figure 4B:
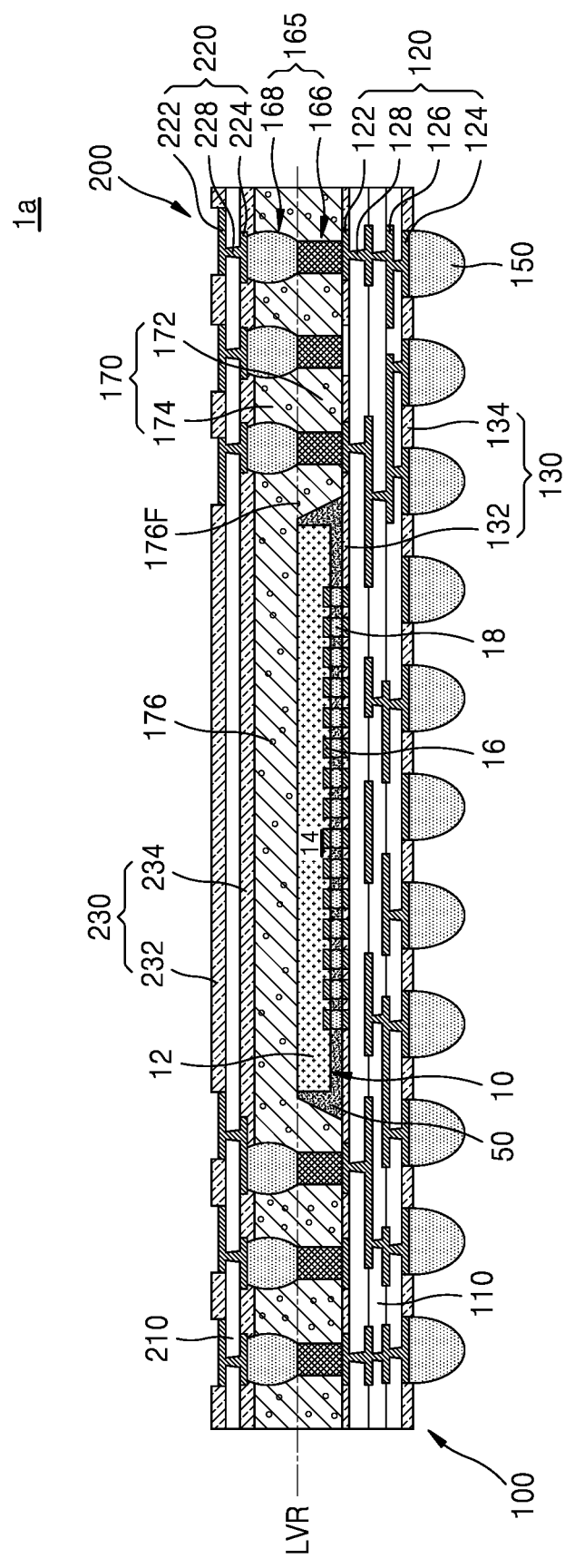
FIG. 4B is a cross-sectional view of a semiconductor package according to an embodiment of the present inventive concepts.

FIG. 4A is a cross-sectional view illustrating a manufacturing method of a semiconductor package according to an embodiment of the present inventive concepts, and FIG. 4B is a cross-sectional view of a semiconductor package 1a according to an embodiment of the present inventive concepts.

Referring to the embodiment of FIG. 4A, the plurality of semiconductor chips 10 and a plurality of lower conductive fillers 166P may be attached onto the support wiring structure array 100P. The under-fill layer 50 surrounding the plurality of chip connection terminals 18 may be formed between the semiconductor chip 10 and the support wiring structure array 100P.

For example, in an embodiment, the lower conductive filler 166P may include Cu or a Cu alloy. In an embodiment, the lower conductive filler 166P may have a cylindrical shape. However, embodiments of the present inventive concepts are not limited thereto.

Referring to the embodiment of FIG. 4B, the semiconductor package 1a may be formed by performing a method similar to that described with respect to the embodiments shown in FIGS. 3C through 3J on the support wiring structure array 100P illustrated in FIG. 4A.

Instead of the plurality of connection structures 160 included in the semiconductor package 1 illustrated in the embodiment of FIG. 1A, the semiconductor package 1a illustrated in the embodiment of FIG. 4B may include a plurality of connection structures 165. Each of the plurality of connection structures 165 may include a lower connection unit 166 having an upper surface positioned at the reference level LVR and extending below the reference level LVR and an upper connection unit 168 having a lower surface positioned at the reference level LVR and extending above the reference level LVR. For example, the reference level LVR may be a boundary between the lower connection unit 166 and the upper connection unit 168.

The upper connection unit 168 may be formed in substantially the same manner as the upper connection unit 164 illustrated in the embodiment of FIG. 1A. The lower connection unit 166 may be formed by removing a portion of the upper side of the lower conductive filler 166P illustrated in the embodiment of FIG. 4A, similar to the manufacturing method of the lower connection unit 162 described with respect to the embodiments of FIGS. 3D and 3E. Accordingly, the lower connection unit 166 may have a cylindrical shape, and the upper surfaces of each of the lower filling unit 172, the plurality of semiconductor chips 10 in which the portion of the upper side thereof has been removed, and the plurality of lower connection units 166 may be coplanar at the reference level LVR. In an embodiment, the upper surface of the lower connection unit 166 may have a circular shape.

FIGS. 5A through 5D are enlarged cross-sectional views of connection structures included in a semiconductor package, according to embodiments of the present inventive concepts. The connection structure 165 illustrated in the embodiment of FIG. 4B may be any one of connection structures 165a, 165b, 165c, and 165d illustrated in the embodiments of FIGS. 5A through 5D.

Figure 5A:
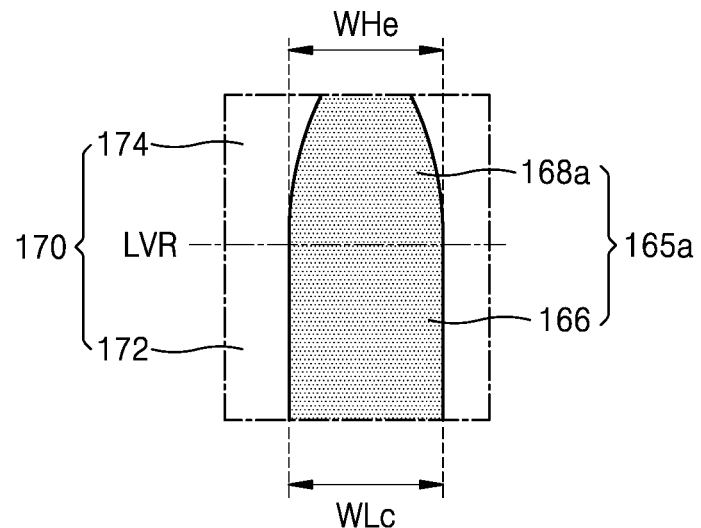
FIGS. 5A through 5D are enlarged cross-sectional views of connection structures included in a semiconductor package, according to embodiments of the present inventive concepts.

Referring to the embodiment of FIG. 5A, the connection structure 165a may include a lower connection unit 166 having an upper surface positioned at the reference level LVR and extending below the reference level LVR and an upper connection unit 168a having a lower surface positioned at the reference level LVR and extending above the reference level LVR. The filling member 170 may cover lateral side surfaces of the plurality of connection structures 165a. The filling member 170 may include the lower filling unit 172 having an upper surface positioned at the reference level LVR and which extends below the reference level LVR and surrounds the lower connection unit 166, and the upper filling unit 174 having a lower surface positioned at the reference level LVR and which extends above the reference level LVR and surrounds the upper connection unit 168a.

The lower connection unit 166 may have a first horizontal width WLc that is substantially uniform in a vertical direction (e.g., extending from a lower surface of the lower connection unit 166 to an upper surface of the lower connection unit 166). The upper connection unit 168a may have a second horizontal width WHe that is the maximum horizontal width at the reference level LVR. As shown in the embodiment of FIG. 5A, the first horizontal width WLc may be the same as the second horizontal width WHe. The connection structure 165a may have a bullet shape having a maximum horizontal width at the reference level LVR and at the entire portion of the connection structure 165a located lower than the reference level LVR.

Figure 5B:
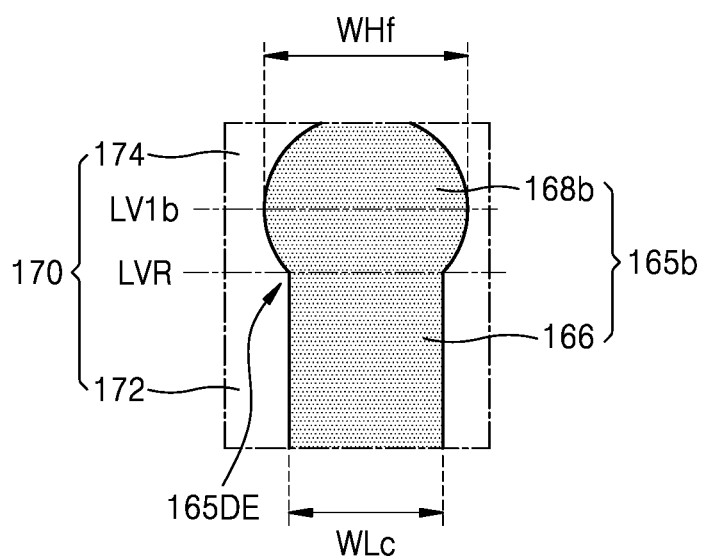

Referring to the embodiment of FIG. 5B, the connection structure 165b may include a lower connection unit 166 having an upper surface positioned at the reference level LVR and extending below the reference level LVR and an upper connection unit 168b having a lower surface positioned at the reference level LVR and extending above the reference level LVR. The filling member 170 may cover lateral side surfaces of the plurality of connection structures 165b. The filling member 170 may include the lower filling unit 172 having an upper surface positioned at the reference level LVR and which extends below the reference level LVR and surrounds the lower connection unit 166, and the upper filling unit 174 having a lower surface positioned at the reference level LVR and which extends above the reference level and surrounds the upper connection unit 168b.

The lower connection unit 166 may have a first horizontal width WLc that is substantially uniform in a vertical direction. The upper connection unit 168b may have a second horizontal width WHf that is a maximum horizontal width at a first level LV1b that is vertically higher than the reference level LVR and is below an upper surface of the upper connection unit 168b. As shown in the embodiment of FIG. 5B, the second horizontal width WHf may be greater than the first horizontal width WLc. The connection structure 165b may have the maximum horizontal width at the first level LV1b that is vertically higher than the reference level LVR. The connection structure 165b may have a dent 165DE having a recessed shape at the reference level LVR.

Figure 5C:
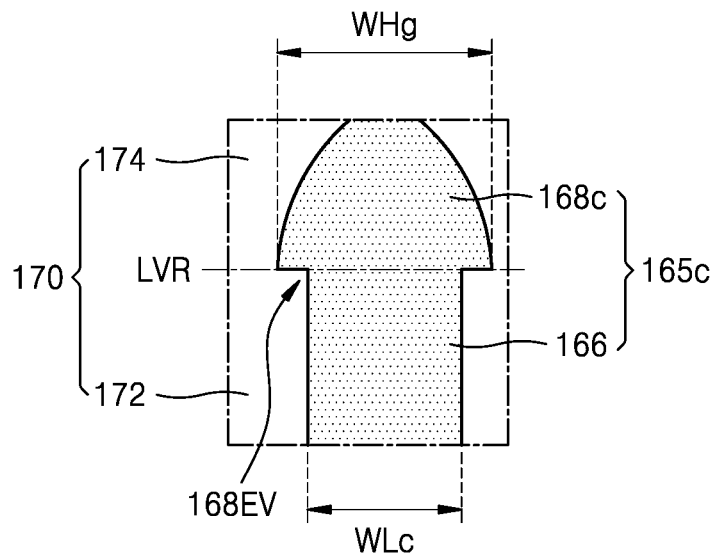

Referring to the embodiment of FIG. 5C, the connection structure 165c may include a lower connection unit 166 having an upper surface positioned at the reference level LVR and extending below the reference level LVR and an upper connection unit 168c having a lower surface positioned at the reference level LVR and extending above the reference level LVR. The filling member 170 may cover lateral side surfaces of the plurality of connection structures 165c. The filling member 170 may include the lower filling unit 172 having an upper surface positioned at the reference level LVR and which extends below the reference level LVR and surrounds the lower connection unit 166, and the upper filling unit 174 having an upper surface positioned at the reference level LVR and which extends above the reference level LVR and surrounds the upper connection unit 168c.

The lower connection unit 166 may have a first horizontal width WLc that is substantially uniform in a vertical direction. The upper connection unit 168c may have a second horizontal width WHg that is the maximum horizontal width at the reference level LVR. As shown in the embodiment of FIG. 5C, the second horizontal width WHg may be greater than the first horizontal width WLc. The connection structure 165c may have the second horizontal width WHg that is a maximum horizontal width at the reference level LVR. The connection structure 165c may include an eave unit 168EV adjacent to the reference level LVR. In some embodiments, the connection structure 165c may include the eave unit 168EV completely surrounding the connection structure 165c at the reference level LVR. For example, the connection structure 165c may have a shape in which an upper connection unit 168c having a relatively larger size is disposed on the lower connection unit 166 having a relatively smaller size. A bottom surface of the eave unit 168EV may extend along the reference level LVR.

Figure 5D:
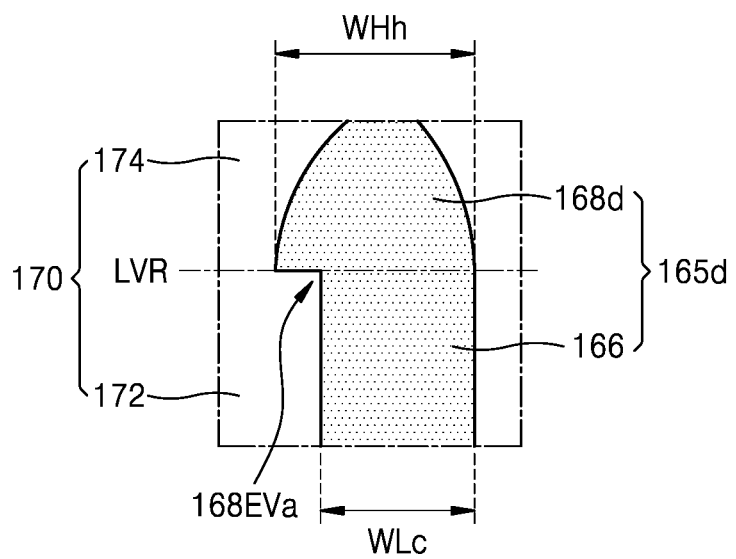

Referring to the embodiment of FIG. 5D, the connection structure 165d may include a lower connection unit 166 having an upper surface positioned at the reference level LVR and extending below the reference level LVR and an upper connection unit 168d having a lower surface positioned at the reference level LVR and extending above the reference level LVR. The filling member 170 may cover lateral side surfaces of the plurality of connection structures

165*d*. The filling member 170 may include the lower filling unit 172 having an upper surface positioned at the reference level LVR and which extends below the reference level LVR and surrounds the lower connection unit 166, and the upper filling unit 174 having a lower surface positioned at the reference level LVR and which extends above the reference level LVR and surrounds the upper connection unit 168*d*.

The lower connection unit 166 may have a first horizontal width WLc that is substantially uniform in a vertical direction. The upper connection unit 168*d* may have a second horizontal width WHh that is the maximum horizontal width at the reference level LVR. As shown in the embodiment of FIG. 5D, the second horizontal width WHh may be greater than the first horizontal width WLc. The connection structure 165*d* may have the second horizontal width WHh that is a maximum horizontal width at the reference level LVR. The connection structure 165*d* may include an eave unit 168EVa adjacent to the reference level LVR. The connection structure 165*d* may include the eave unit 168EVa that surrounds only a partial portion of the connection structure 165*d* at the reference level LVR. For example, the connection structure 165*d* may have a shape in which an upper connection unit 168*d* having a relatively larger size is disposed on the lower connection unit 166 having a relatively smaller size. A bottom surface of the eave unit 168EVa may extend along the reference level LVR. For example, at the reference level LVR, a partial portion of a lateral edge of the lower connection unit 166 and a partial portion of a lateral edge of the upper connection unit 168*d* may contact each other, and the remaining portion of the lateral edge of the lower connection unit 166 and remaining portion of the lateral edge of the upper connection unit 168*d* may not contact each other. Accordingly, at the reference level LVR, a partial portion of a sidewall of the lower connection unit 166 and a partial portion of a sidewall of the upper connection unit 168*d* may be connected to each other, and a remaining portion of the sidewall of the lower connection unit 166 where the eave unit 168EVa is arranged and a remaining portion of the sidewall of the upper connection unit 168*d* may not be connected to each other.

Figure 6:
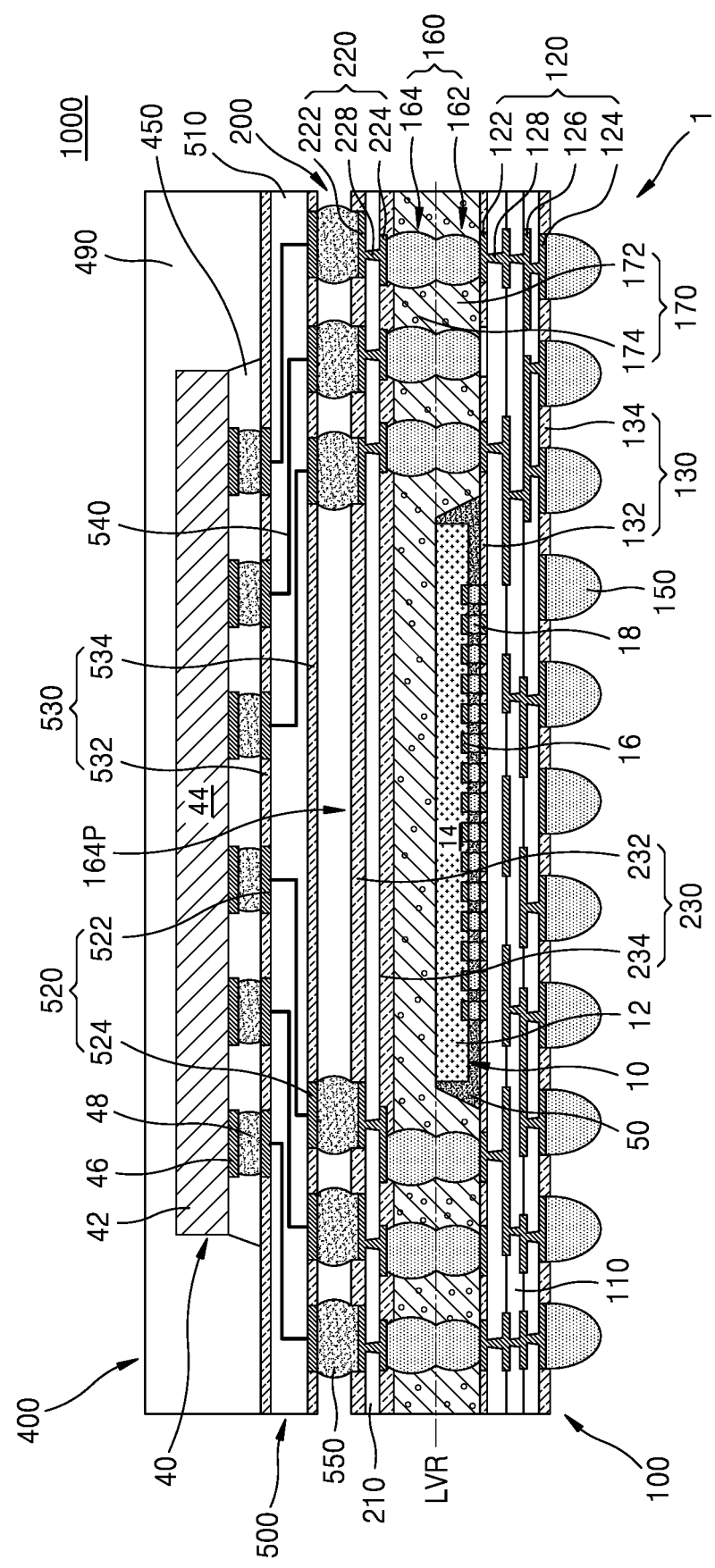
FIGS. 6 and 7 are cross-sectional views of a package-on-package including a semiconductor package, according to embodiments of the present inventive concepts.
Figure 7:
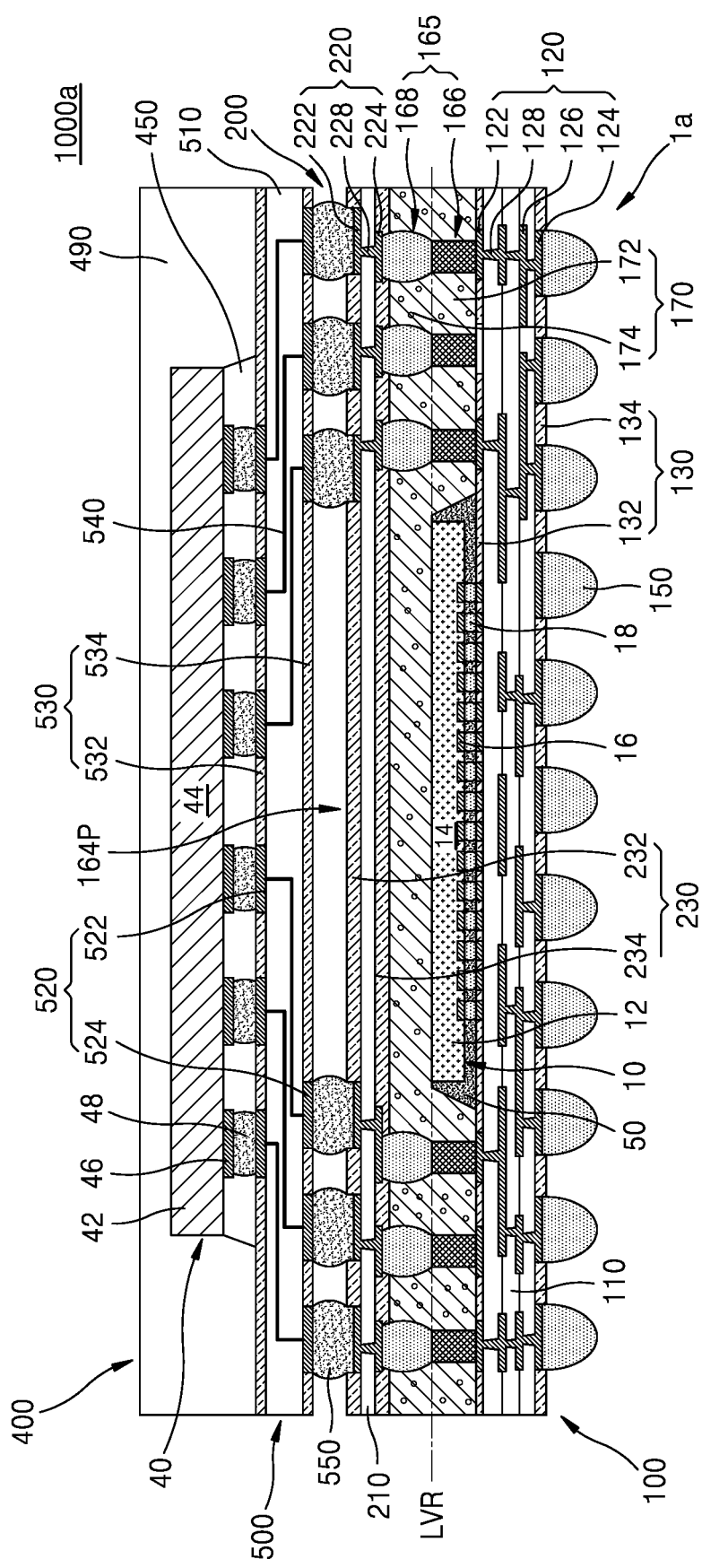

FIGS. 6 and 7 are cross-sectional views of a PoP 1000 including a semiconductor package 1, according to embodiments of the present inventive concepts.

Referring to the embodiment of FIG. 6, the PoP 1000 may include a second semiconductor package 400 stacked on the first semiconductor package 1. The first semiconductor package 1 may be a lower semiconductor package, and the second semiconductor package 400 may be an upper semiconductor package. The first semiconductor package 1 may be substantially the same as the semiconductor package 1 described with reference to the embodiments of FIGS. 1A through 3J, and thus, a detailed description thereof will be omitted for convenience of explanation. The first semiconductor package 1 may include the first semiconductor chip 10, the first semiconductor substrate 12, the first semiconductor device 14, the first chip connection pad 16, the first chip connection terminal 18, and the first under-fill layer 50. The first semiconductor chip 10, the first semiconductor substrate 12, the first semiconductor device 14, the first chip connection pad 16, the first chip connection terminal 18, and the first under-fill layer 50 may be substantially the same as the semiconductor chip 10, the semiconductor substrate 12, the semiconductor element 14, the chip connection pad 16, the chip connection terminal 18, and the under-fill layer 50 described with reference to the embodiments of FIGS. 1A and 1B, respectively.

The second semiconductor package 400 may include at least one second semiconductor chip 40. The second semiconductor package 400 may be electrically connected to the first semiconductor package 1 via a plurality of package connection terminals 550 attached to the plurality of second upper pads 222 of the first semiconductor package 1.

The second semiconductor chip 40 may include the second semiconductor substrate 42 having the second semiconductor device 44 formed on an active surface thereof, and the plurality of second chip connection pads 46 disposed on the active surface of the second semiconductor substrate 42. The second semiconductor substrate 42, the second semiconductor device 44, and the second chip connection pad 46 may be similar to the semiconductor substrate 12, the semiconductor device 14, and the chip connection pad 16 described with reference to the embodiments of FIGS. 1A and 1B, respectively, and thus, detailed descriptions thereof will be omitted for convenience of explanation.

At least one second semiconductor chip 40 may include a memory semiconductor chip. In an embodiment, the at least one second semiconductor chip 40 may include, for example, a DRAM chip, an SRAM chip, a flash memory chip, an EPROM chip, a PRAM chip, an MRAM chip, or an RRAM chip.

In the embodiment of FIG. 6, it is illustrated that at least one second semiconductor chip 40 of the second semiconductor package 400 is mounted on the package base substrate 500 in a flip chip method. However, embodiments of the present inventive concepts are not limited thereto. The PoP 1000 may include at least one second semiconductor chip 40, and may include all types of semiconductor packages, to which the package connection terminal 550 is attachable thereunder for electrical connection to the first semiconductor package 1, as the upper semiconductor package.

The package base substrate 500 may include a base board layer 510, and a plurality of board pads 520 disposed on upper and lower surfaces of the base board layer 510. The plurality of board pads 520 may include a plurality of upper board pads 522 disposed on the upper surface of the base board layer 510 and a plurality of lower board pads 524 disposed on the lower surface of the base board layer 510. In some embodiments, the package base substrate 500 may include a PCB. For example, the package base substrate 500 may include a multi-layer PCB. In an embodiment, the second base layer 510 may include at least one material selected from phenol resin, epoxy resin, and polyimide.

A board solder resist layer 530 exposing a plurality of board pads 520 may be formed on upper and lower surfaces of the base board layer 510. As shown in the embodiment of FIG. 6, the board solder resist layer 530 may include an upper board solder resist layer 532 covering the upper surface of the base board layer 510 and exposing a plurality of upper board pads 522, and a lower board solder resist layer 534 covering the lower surface of the base board layer 510 and exposing a plurality of lower board pads 524.

The package base substrate 500 may include a board wiring 540 electrically connecting the plurality of upper board pads 522 to the plurality of lower board pads 524 in the base board layer 510. The board wiring 540 may include a board wiring line and a board wiring via. In an embodiment, the board wiring 540 may include at least one compound selected from copper, nickel, stainless steel, and beryllium copper. In some embodiments, the board wiring 540 may be positioned between the upper surface of the base board layer 510 and the upper board solder resist layer 532, and/or the lower surface of the base board layer 510 and the lower board solder resist layer 534.

The plurality of upper board pads 522 may be electrically connected to the second semiconductor chip 40. For example, a plurality of second chip connection terminals 48 may be disposed between the plurality of second chip connection pads 46 of the second semiconductor chip 40 and the plurality of upper board pads 522 of the package base substrate 500, and may electrically connect the second semiconductor chip 40 to the package base substrate 500. In some embodiments, the second under-fill layer 450 surrounding the plurality of second chip connection terminals 48 may be disposed between the second semiconductor chip 40 and the package base substrate 500. In an embodiment, the second under-fill layer 450 may include, for example, an epoxy resin formed by a capillary under-fill method. In some embodiments, the second under-fill layer 450 may include a non-conductive film.

A molding layer 490 surrounding the second semiconductor chip 40 may be disposed on the package base substrate 500. In an embodiment, the molding layer 490 may include, for example, an EMC. In some embodiments, the molding layer 490 may cover an inactive surface of the second semiconductor chip 40. In some other embodiments, the molding layer 490 may cover a lateral side surface of the second semiconductor chip 40 but not the inactive surface thereof, and a heat dissipation member may be attached to the inactive surface of the second semiconductor chip 40.

Referring to the embodiment of FIG. 7, the PoP 1000a may include a second semiconductor package 400 stacked on the first semiconductor package 1a. The first semiconductor package 1a may be a lower semiconductor package, and the second semiconductor package 400 may be an upper semiconductor package. The first semiconductor package 1a may be substantially the same as the semiconductor package 1a described with reference to the embodiments of FIGS. 4A and 4B, the second semiconductor package 400 may be substantially the same as the second semiconductor package 400 described with reference to the embodiment of FIG. 6, and thus, detailed descriptions thereof will be omitted for convenience of explanation.

Referring to the embodiments of FIGS. 6 and 7 together, the PoPs 1000 and 1000a according to the present inventive concepts may include a plurality of connection structures 160 and 165 formed to prevent a short circuit failure, and may include the first semiconductor packages 1 and 1a increasing the electrical connection reliability between the support wiring structure 100 and the cover wiring structures 200. Accordingly, the second semiconductor package 400 stacked on the cover wiring structure 200 may increase the reliability with and be electrically connected to the support wiring structure 100 via the cover wiring structure 200 and the plurality of connection structures 160 and 165.

In addition, since the semiconductor PoPs 1000 and 1000a according to the present inventive concepts include the thin-type semiconductor packages 1 and 1a, the semiconductor PoPs 1000 and 1000a may be formed in a thin type with reduced overall heights.

While the present inventive concepts have been particularly shown and described with reference to embodiments thereof, it will be understood that various changes in form and details may be made therein without departing from the spirit and scope of the following claims.

What is claimed is:
1. A semiconductor package comprising:
a support wiring structure;
a semiconductor chip on the support wiring structure, the semiconductor chip having an upper surface positioned at a vertical level that is a reference level;
a cover wiring structure on the semiconductor chip;
a plurality of connection structures penetrating a filling member and configured to electrically connect the support wiring structure to the cover wiring structure; and
the filling member fills a space between the support wiring structure and the cover wiring structure, the filling member surrounding the plurality of connection structures and the semiconductor chip and including a plurality of fillers;
wherein a partial portion of the plurality of fillers includes cutting fillers having a flat surface that extends along the reference level, wherein the flat surface of the cutting fillers extending along the reference level directly contacts the filling member.

2. The semiconductor package of claim 1, wherein the flat surface of the cutting filler is an upper surface of the cutting filler, and a remaining portion of the cutting filler extends below the reference level.

3. The semiconductor package of claim 1, wherein each of the plurality of connection structures has an entasis shape and a maximum horizontal width of the plurality of connection structures is positioned at the reference level.

4. The semiconductor package of claim 1, wherein each of the plurality of connection structures includes a dent unit having a recessed shape at the reference level.

5. The semiconductor package of claim 1, wherein each of the plurality of connection structures has a bullet shape in which a maximum horizontal width of the plurality of connection structures is positioned at the reference level and at an entire portion extending below the reference level.

6. The semiconductor package of claim 1, wherein each of the plurality of connection structures includes an eave unit adjacent to the reference level.

7. The semiconductor package of claim 6, wherein a bottom surface of the cave unit extends along the reference level.

8. The semiconductor package of claim 6, wherein the cave unit completely surrounds the connection structure.

9. The semiconductor package of claim 6, wherein the cave unit partially surrounds the connection structure.

10. The semiconductor package of claim 1, wherein each of the support wiring structure and the cover wiring structure comprises a printed circuit board (PCB).

11. A semiconductor package comprising:
a support wiring structure;
a semiconductor chip on the support wiring structure, the semiconductor chip having an upper surface positioned at a vertical level that is a reference level;
a cover wiring structure on the semiconductor chip;
a plurality of connection structures penetrating a filling member and configured to electrically connect the support wiring structure to the cover wiring structure, the plurality of connection structures are spaced apart from the semiconductor chip, and arranged around the semiconductor chip, each of the plurality of connection structures including a lower connection unit having an upper surface positioned at the reference level and extending below the reference level and an upper connection unit having a lower surface positioned at the reference level and extending above the reference level; and
the filling member fills a space between the support wiring structure and the cover wiring structure, the filling member surrounding the plurality of connection structures and comprising a plurality of fillers,
wherein a partial portion of the plurality of fillers comprises cutting fillers having an upper surface that is a flat surface that extends along the reference level, wherein the flat surface of the cutting fillers extending along the reference level directly contacts the filling member.

12. The semiconductor package of claim 11, wherein each of the plurality of connection structures comprises a conductive solder and the lower connection unit is integrated with the upper connection unit.

13. The semiconductor package of claim 11, wherein:
the lower connection unit of each of the plurality of connection structures comprises a conductive filler; and
the upper connection unit thereof comprises a conductive solder.

14. The semiconductor package of claim 11, wherein the lower connection unit has a horizontal width that is uniform; and an upper surface of the lower connection unit is positioned at the reference level.

15. The semiconductor package of claim 11, wherein each of the plurality of connection structures has a maximum horizontal width at the reference level.

16. The semiconductor package of claim 11, wherein each of the plurality of connection structures comprises a dent unit having a recessed shape at the reference level.

17. The semiconductor package of claim 11, wherein the upper connection unit of each of the plurality of connection structures comprises an eave unit having a bottom surface extending along the reference level.

18. A package-on-package comprising:
a first semiconductor package comprising: a first printed circuit board (PCB); a first semiconductor chip on the first PCB and having an upper surface positioned at a vertical level that is a reference level; a second PCB on the first semiconductor chip; a filling member filling a space between the first PCB and the second PCB, the filling member surrounding the first semiconductor chip and containing a plurality of fillers; and a plurality of connection structures penetrating the filling member, the plurality of connection structures is configured to electrically connect the first PCB to the second PCB; and
a second semiconductor package comprising: a second semiconductor chip; and a package connection terminal attached to a portion of a plurality of second wiring patterns and configured to electrically connect the second semiconductor Chip to the first semiconductor package, the second semiconductor package is stacked on the first semiconductor package,
wherein a partial portion of the plurality of fillers are cutting fillers having an upper surface that is a flat surface that extends along the reference level and a side surface that is a curved surface and is positioned at a vertical level that is lower than the reference level, wherein the flat surface of the cutting fillers extending along the reference level directly contacts the filing member.

19. The package-on-package of claim 18, wherein:
a first thickness of a portion of the filling member extending below the reference level is greater than a second thickness of a portion thereof extending above the reference level; and
the first thickness is in a range of about 60 μm to about 90 μm.

* * * * *